United States Patent
Takemura

(10) Patent No.: US 9,729,137 B2
(45) Date of Patent: Aug. 8, 2017

(54) SEMICONDUCTOR CIRCUIT, VOLTAGE DETECTION CIRCUIT, AND VOLTAGE DETERMINATION CIRCUIT

(71) Applicant: LAPIS SEMICONDUCTOR CO., LTD., Kanagawa (JP)

(72) Inventor: Takashi Takemura, Kanagawa (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 14/936,167

(22) Filed: Nov. 9, 2015

(65) Prior Publication Data
US 2016/0134274 A1     May 12, 2016

(30) Foreign Application Priority Data

Nov. 11, 2014  (JP) .................. 2014-229257
Mar. 20, 2015  (JP) .................. 2015-058521

(51) Int. Cl.
*H03L 7/00* (2006.01)
*H03K 17/22* (2006.01)

(52) U.S. Cl.
CPC .................. *H03K 17/223* (2013.01)

(58) Field of Classification Search
CPC .................. H03K 17/223
See application file for complete search history.

(56) References Cited

U.S. PATENT DOCUMENTS

| 2003/0076138 A1* | 4/2003 | Hwang | G06F 1/26 327/143 |
| 2007/0210840 A1* | 9/2007 | Zhu | H03K 17/223 327/143 |
| 2009/0167263 A1* | 7/2009 | Wang | G05F 3/262 323/266 |

FOREIGN PATENT DOCUMENTS

JP        2011-086989 A        4/2011

* cited by examiner

*Primary Examiner* — Daniel Puentes
(74) *Attorney, Agent, or Firm* — Volentine & Whitt, PLLC

(57) ABSTRACT

The present disclosure provides a semiconductor circuit including: a PMOS transistor that includes a first source connected to a power supply, a first drain, and a first gate to which a fixed potential is supplied; an output circuit that outputs a first output signal, which is a reset signal or a power-on signal, and that outputs a second output signal according to a potential of the first drain; a constant current source connected to the first drain; and an NMOS transistor that includes a second source to which a fixed potential is supplied, a second drain connected to the first drain, and a second gate to which the second output signal from the output circuit is applied.

3 Claims, 20 Drawing Sheets

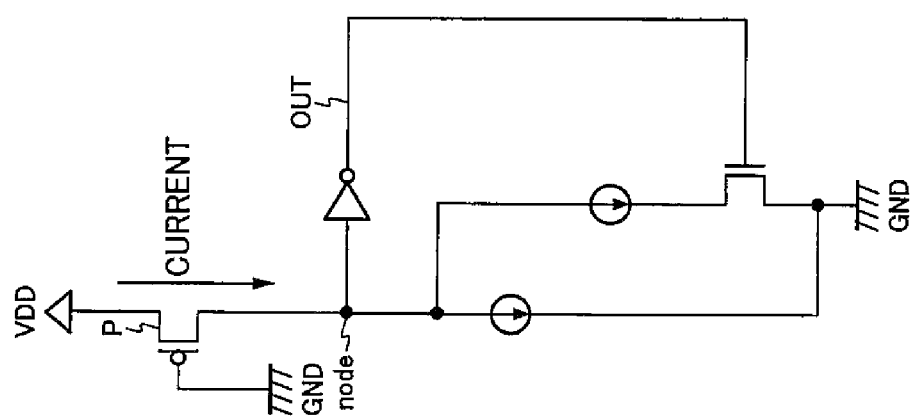

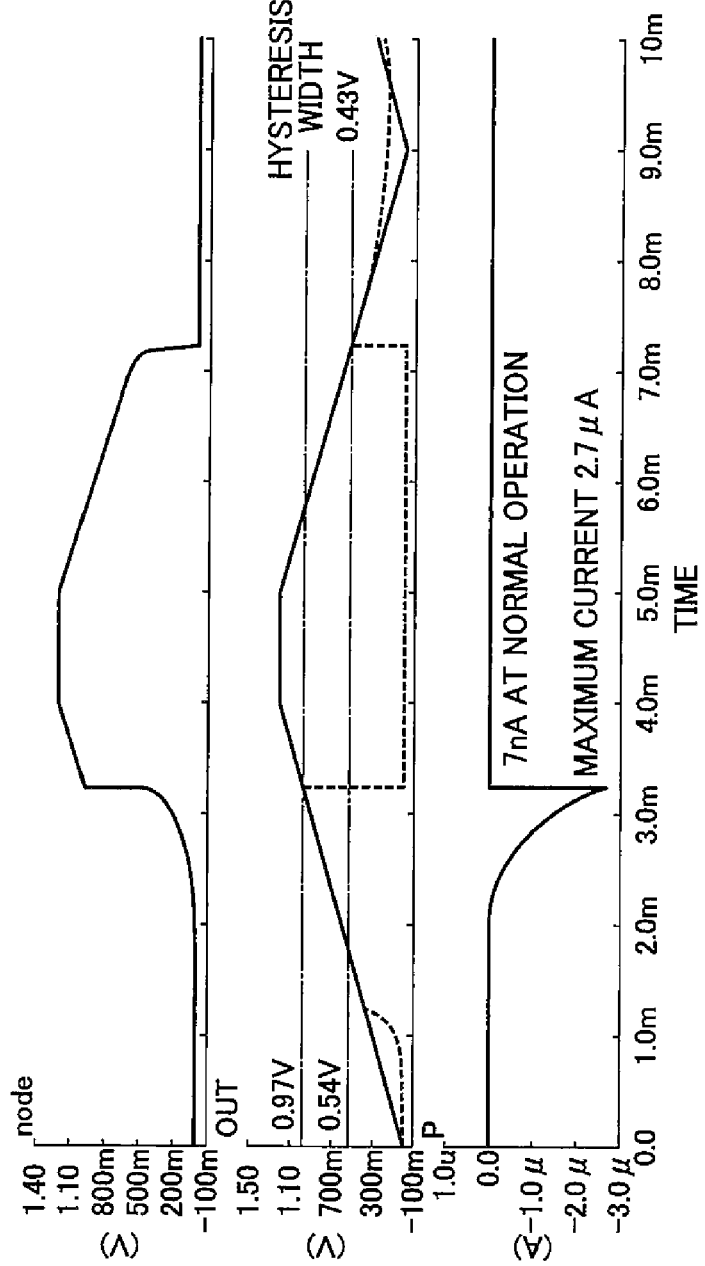

SEMICONDUCTOR CIRCUIT, VOLTAGE DETECTION CIRCUIT, AND VOLTAGE DETERMINATION CIRCUIT

CROSS-REFERENCE TO RELATED APPLICATIONS

This application claims priority under 35 USC 119 from Japanese Patent Application No. 2014-229257 filed on Nov. 11, 2014, and Japanese Patent Application No. 2015-058521 filed on Mar. 20, 2015, the disclosures of which are incorporated by reference herein.

BACKGROUND

Technical Field

The present disclosure relates to a semiconductor circuit in a semiconductor integrated circuit, a voltage detection circuit, and a voltage determination circuit.

Related Art

Conventionally, power-on reset circuits that detect turning-on and shutdown of a power supply in a semiconductor integrated circuit, and that generate reset release signal or a reset signal in the semiconductor integrated circuit, have been used (for example, see Japanese Patent Application Laid-Open (JP-A) No. 2011-86989). FIG. 17 illustrates an example of the conventional power-on reset circuit. Hereinafter, a description will be made regarding a configuration and an operation of the conventional power-on reset circuit with reference to FIG. 17.

First, regarding the configuration, the conventional power-on reset circuit is configured by a detection block C1 including a PMOS transistor P1 of which a gate is connected to GND, and an NMOS transistor N1 of which a gate is connected to BIAS to be input from an external bias circuit, and a detection block C2 including the same configuration, and a logic circuit, as illustrated in FIG. 17.

Here, the PMOS transistor P1 included in the detection block C1 and a PMOS transistor P2 included in the detection block C2 are configured using transistors having different threshold values. A threshold Vtp1 of the PMOS transistor P1 and a threshold Vtp2 of the PMOS transistor P2 are set such that Vtp1<Vtp2.

In addition, the NMOS transistor N1 included in the detection block C1 and an NMOS transistor N2 included in the detection block C2 function as constant current sources when a constant voltage is applied to each gate from the external bias circuit.

Next, the operation will be described with reference to an operation waveform of the conventional power-on reset circuit illustrated in FIG. 18.

First, when a power supply VDD becomes equal to or higher than the threshold of the PMOS transistor P1 during a rise of the power supply VDD, the PMOS transistor P1 is turned ON, and the detection block C1 outputs an H-level.

At this time, the detection block C2 outputs an L-level, input of an RS latch configured of a two-input NOR circuit L6 and a two-input NOR circuit L7, a node n1 and a node n2 become states as illustrated in FIG. 18, and an output OUT becomes the H-level having a voltage level Von along with switching of the node n1.

Similarly, during a fall of the power supply VDD, the output OUT becomes the L-level having a voltage level Voff along with switching of the node n2.

In this manner, the conventional power-on reset circuit is configured to detect different voltages using the two detection blocks.

However, in the conventional power-on reset circuit illustrated in FIG. 17, it is necessary to provide the MOS transistors having the two types of threshold values so as to set different power-on reset threshold voltages between the rising state and the falling state of the power supply. Accordingly, the number of steps in a semiconductor process increases, and further, a circuit size and current consumption increase together, since it is necessary to provide the two detection blocks in the power-on reset circuit.

SUMMARY

The present disclosure provides a semiconductor circuit, a voltage detection circuit, and a voltage determination circuit that may suppress an increase in a circuit size and current consumption, and setting different power-on reset threshold voltages between a rise state and a falling state of a power supply.

A semiconductor circuit according to a first aspect includes: a PMOS transistor that includes a first source connected to a power supply, a first drain, and a first gate to which a fixed potential is supplied; an output circuit that outputs a first output signal, which is a reset signal or a power-on signal, and that outputs a second output signal according to a potential of the first drain; a constant current source connected to the first drain; and an NMOS transistor that includes a second source to which a fixed potential is supplied, a second drain connected to the first drain, and a second gate to which the second output signal from the output circuit is applied.

A semiconductor circuit according to a second aspect includes: an NMOS transistor that includes a first source to which a fixed potential is supplied, a first drain, and a first gate connected to a power supply; an output circuit that outputs a first output signal, which is a reset signal or a power-on signal, and that outputs a second output signal according to a potential of the first drain; a constant current source connected to the first drain; and a PMOS transistor that includes a second source connected to the power supply, a second drain connected to the first drain, and a second gate to which the second output signal from the output circuit is supplied.

A semiconductor circuit according to a third aspect includes: a PMOS transistor that includes a first source connected to a power supply, a first drain, and a first gate to which a fixed potential is supplied; a control circuit that includes a second source to which a fixed potential is supplied, a second drain connected to the first drain, and an NMOS transistor which includes a second gate; and an output circuit that outputs a first output signal, which is a reset signal or a power-on signal, and outputs a second output signal according to a potential of the first drain, wherein the control circuit increases the reference current so as to increase a threshold voltage corresponding to the reference current flowing in the PMOS transistor in a case in which the power supply in a rise state, and decreases the reference current so as to decrease a threshold voltage corresponding to the reference current flowing in the PMOS transistor in a case in which the power supply is in a falling state according to the second output signal which is output from the output circuit.

A semiconductor circuit according to a fourth aspect includes: an NMOS transistor that includes a first source to which a fixed potential is supplied, a first drain, and a first gate connected to a power supply; a control circuit that includes a PMOS transistor which includes a second source connected to the power supply, a second drain connected to the first drain, and an second gate; and an output circuit that outputs a first output signal, which is a reset signal or a power-on signal, and outputs a second output signal according to a potential of the first drain, wherein the control circuit increases the reference current so as to increase a threshold voltage corresponding to the reference current flowing in the NMOS transistor in a case in which the power supply in a rise state, and decreases the reference current so as to decrease a threshold voltage corresponding to the reference current flowing in the NMOS transistor in a case in which the power supply is in a falling state according to the second output signal which is output from the output circuit.

In addition, a voltage detection circuit according to a fifth aspect includes the semiconductor circuit according to the first aspect.

In addition, a voltage determination circuit according to a sixth aspect includes the semiconductor circuit according to the first aspect.

According to the above aspects, the present disclosure may suppress the increase in the circuit size and the current consumption, and set different power-on reset threshold voltages between the rise state and the falling state of the power supply.

BRIEF DESCRIPTION OF THE DRAWINGS

Exemplary embodiments will be described in detail based on the following figures, wherein:

FIG. 15A and FIG. 15B are diagrams illustrating waveforms obtained by operation simulation;

DETAILED DESCRIPTION

Hereinafter, exemplary embodiments will be described in detail with reference to the drawings.

First Exemplary Embodiment

Figure 1:
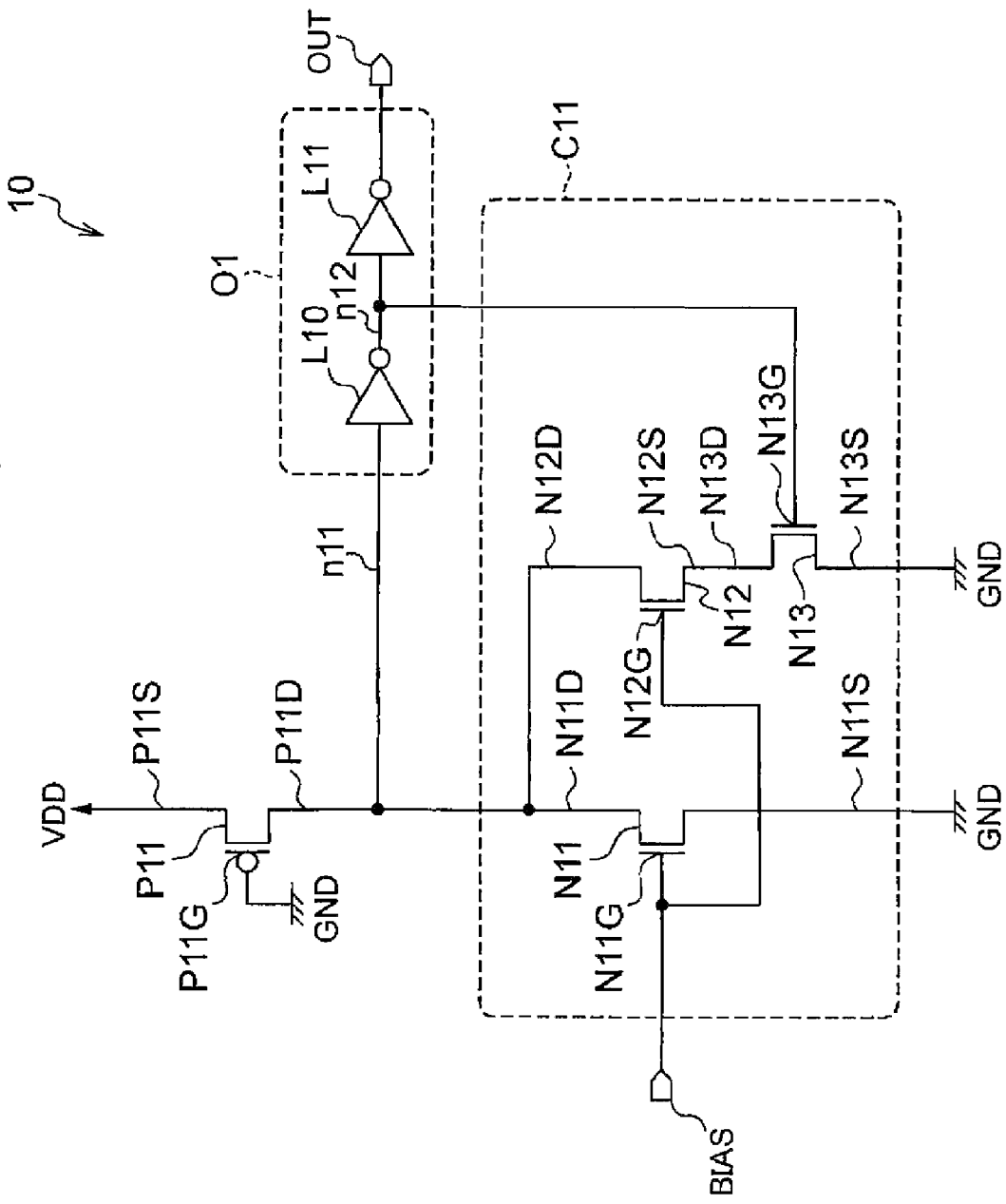
FIG. 1 is a circuit diagram illustrating a schematic configuration of a power-on reset circuit according to a first exemplary embodiment.

FIG. 1 is a circuit diagram illustrating a power-on reset circuit according to a first exemplary embodiment. The power-on reset circuit 10 according to the first exemplary embodiment includes a PMOS transistor P11, a control circuit C11, and an output circuit O1 as illustrated in FIG. 1.

The PMOS transistor P11 includes a first source P11S which is connected to a power supply, a first drain P11D, and a first gate P11G to which a fixed potential is supplied. In this exemplary embodiment, a description will be made by exemplifying a case in which a ground potential is used as the fixed potential.

The control circuit C11 includes a first NMOS transistor N11 (hereinafter, simply referred to as the NMOS transistor N11), a second NMOS transistor N12 (hereinafter, simply referred to as the NMOS transistor N12), and a third NMOS transistor N13 (hereinafter, simply referred to as the NMOS transistor N13).

The NMOS transistor N11 includes a second source N11S to which a fixed potential is supplied, a second drain N11D which is connected to the first drain P11D, and a second gate N11G to which a bias potential is applied. The second gate N11G is connected to a bias circuit which supplies a bias potential. The bias potential supplied by the bias circuit allows a constant current to flow between the second source N11S and the second drain N11D of the NMOS transistor N11, and thus configure a constant current source.

The NMOS transistor N12 includes a third source N12S, a third drain N12D which is connected to and the first drain P11D, and a third gate N12G to which a bias potential is applied. The third gate N12G is connected to the bias circuit which supplies a bias potential. The bias potential supplied by the bias circuit allows a constant current to flow between the third source N12S and the third drain N12D of the NMOS transistor N12, and thus configure the constant current source.

The NMOS transistor N13 includes a fourth source N13S to which a fixed potential is supplied, a fourth drain N13D which is connected to the third source N12S, and a fourth gate N13G to which a second output signal from the output circuit O1 is applied. The fourth gate N13G of the NMOS transistor N13 is connected to output of an inverter L10 of the output circuit O1 as illustrated in FIG. 1. The NMOS transistor N13 controls the NMOS transistor N12 according to the second output signal output from the inverter L10.

The output circuit O1 outputs a first output signal (hereinafter, simply referred to as an output signal OUT), which is a reset signal or a power-on signal, and outputs the second output signal (hereinafter, referred to as a control signal) according to a potential of a connection point between the first drain P11D and the second drain N11D. The output circuit O1 can be configured using a logic circuit, and is configured using a series circuit including the inverter L10 and an inverter L11 in the first exemplary embodiment such that a potential of a connection point between the inverter L10 and the inverter L11 is output as the control signal, and output of the inverter L11 is output as the output signal OUT. The inverter L10 and the inverter L11 are configured using, for example, CMOS inverters.

In addition, the control circuit C11 increases a reference current so as to increase a threshold voltage that corresponds to the reference current flowing in the PMOS transistor P11 in a case in which the power supply in a rise state, and decreases a reference current so as to decrease a threshold voltage that corresponds to the reference current flowing in the PMOS transistor P11 in a case in which the power supply is in a falling state, according to the control signal which is output from the output circuit O1.

Figure 2:
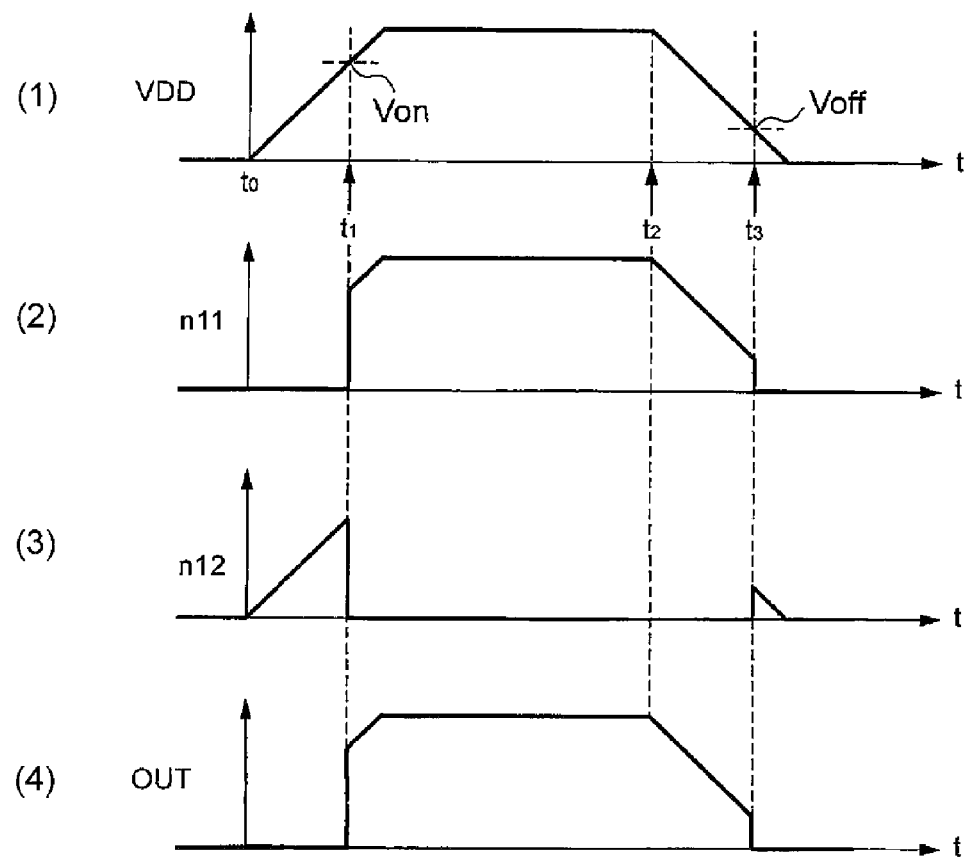
FIG. 2 is a diagram illustrating operation waveforms of the power-on reset circuit according to a first exemplary embodiment.

Next, an operation of the power-on reset circuit 10 will be described. FIG. 2 is operation waveform diagram at the time of turning ON the power supply of the power-on reset circuit 10 according to the first exemplary embodiment.

The operation waveform illustrated in (1) of FIG. 2 represents a potential of a power supply VDD of the power-on reset circuit 10 of FIG. 1. The operation waveform illustrated (2) of FIG. 2 represents a potential of a node n11 of the power-on reset circuit 10 of FIG. 1. The operation waveform illustrated in (3) of FIG. 2 represents a potential of a node n12 of the power-on reset circuit 10 of FIG. 1. The operation waveform illustrated in (4) of FIG. 2 represents a potential of an output terminal OUT of the power-on reset circuit 10 of FIG. 1. As illustrated in (1) of FIG. 2, a threshold voltage corresponding to a reference current flowing in the PMOS transistor P11 and a power-on reset threshold voltage matches.

First, when the power supply of the power-on reset circuit 10 of FIG. 1 is turned ON at a time t0, the power supply VDD rises as illustrated in (1) of FIG. 2. Since the current flows in the NMOS transistor N11 at the time of start of the rise in the power supply, the node n11 serving as input of the inverter L10 becomes the L-level and the output signal OUT also becomes the L-level as illustrated in (2) and (4) of FIG. 2.

Here, power supply of the inverter L10 is supplied from the VDD, however, the inverter L10 is capable of operating at a low voltage. Thus, it is possible to output the H-level in the node n12 serving as output of the inverter L10 as illustrated in (3) of FIG. 2, even when the node n11 serving as the input of the inverter L10 is the L-level as illustrated in (2) of FIG. 2, from the time t0 to a time t1.

At this time, since the output of the inverter L10 is the H-level as illustrated in (3) of FIG. 2, the NMOS transistor N13 is turned ON, current flows between the source and the drain of the NMOS transistor N13. Further, when the current flows between the source and the drain of the NMOS transistor N13, current flows also between the source and the drain of the NMOS transistor N12.

Thus, a reference current flowing in the PMOS transistor P11 increases by the amount of the current flowing in the NMOS transistor N12, as a result of which a threshold voltage of the PMOS transistor P11 in response to the reference current increases.

Figure 3:
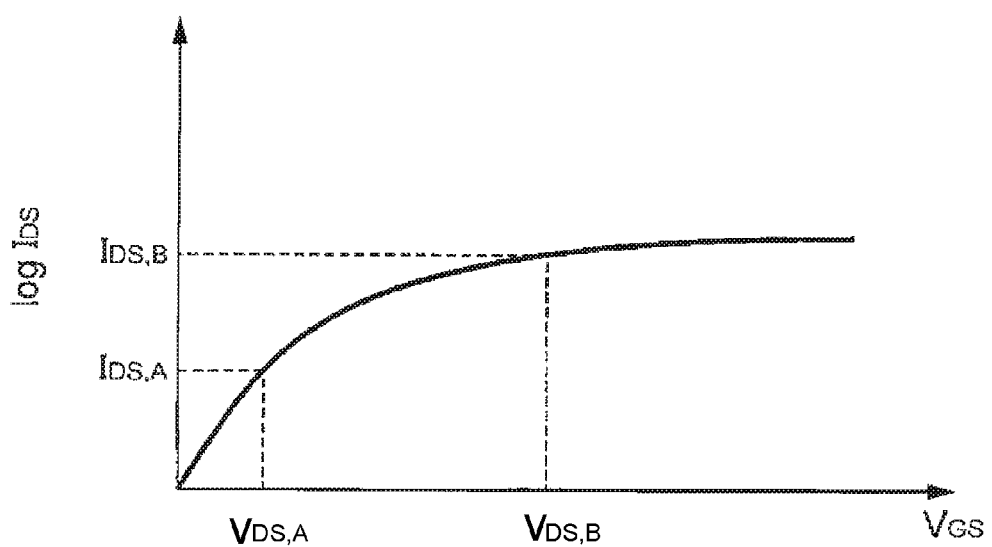
FIG. 3 is a diagram for describing an operation principle of an exemplary embodiment according to the invention.

FIG. 3 illustrates a diagram for describing how a threshold voltage of the PMOS transistor P11 is determined. In a graph illustrated in FIG. 3, a horizontal axis represents a voltage $V_{GS}$ between the gate P11G and the source P11S of the PMOS transistor P11, and a vertical axis represents logarithm of a reference current $I_{DS}$ flowing between the source P11S and the drain P11D of the PMOS transistor P11.

In FIG. 3, it is assumed that a reference current flowing in the PMOS transistor P11 is $I_{DS,A}$ in a case in which current does not flow in the NMOS transistor N12. In a case in which current does not flow in the NMOS transistor N12, the reference current $I_{DS,A}$ reflects only the amount of the current flowing in the NMOS transistor N11, and a threshold voltage of the PMOS transistor P11 corresponding to the reference current $I_{DS,A}$ corresponds to $V_{DS,A}$.

On the other hand, when current flows in the NMOS transistor N12, the reference current $I_{DS,A}$ is added with the amount of the current flowing in the NMOS transistor N12 as illustrated in FIG. 3, and thus, the reference current $I_{DS,A}$ increases to be $I_{DS,B}$. Further, a threshold voltage of the PMOS transistor P11 corresponding to the reference current $I_{DS,B}$ becomes $V_{DS,B}$. Accordingly, when the current flows in the NMOS transistor N12, the threshold voltage of the PMOS transistor P11 increases from $V_{DS,A}$ to $V_{DS,B}$.

Thus, a threshold voltage of the PMOS transistor P11 is determined corresponding to a reference current flowing in the PMOS transistor P11. In addition, the reference current flowing in the PMOS transistor P11 is determined according to a sum of the current flowing in the NMOS transistor N11, and the current flowing in the NMOS transistor N12.

Next, returning to (1) and (4) of FIG. 2, when the power supply VDD exceeds a threshold voltage of the PMOS transistor P11 at the time t1, the PMOS transistor P11 is turned on, as a result of which the input of the inverter L10 becomes the H-level, and the output signal OUT also becomes the H-level as illustrated in (2) and (4) of FIG. 2.

At this time, since the node n12 serving as the output of the inverter L10 is the L-level as illustrated in (3) of FIG. 2, the NMOS transistor N13 is turned OFF and current does not flow between the source and the drain of the NMOS transistor N13. Accordingly, current does not flow also between the source and the drain of the NMOS transistor N12. Thus, a reference current flowing in the PMOS transistor P11 reflects only the amount of the current flowing in the NMOS transistor N11. Thus, a threshold voltage of the PMOS transistor P11 becomes lower than a threshold voltage at the rising state of the power supply.

Further, the power supply VDD starts to fall at a time t2 as illustrated in (1) of FIG. 2. Here, since the threshold voltage of the PMOS transistor P11 is lower than that at the rising state of the power supply VDD, the reset signal is not output even when the power supply becomes lower than a threshold voltage Von at the rising state as illustrated in (4) of FIG. 2.

Next, when the power supply VDD becomes lower than a threshold voltage Voff of the PMOS transistor P11 at a time t3 as illustrated in (2) of FIG. 2, the reset signal is output as illustrated in (4) of FIG. 2.

As a result, in a case in which the power supply VDD is equal to or lower than a threshold voltage of the PMOS transistor P11, a threshold voltage of the PMOS transistor P11 increases. In addition, in a case in which the power supply VDD is higher than a threshold voltage of the PMOS transistor P11, a threshold voltage of the PMOS transistor P11 decreases. Accordingly, the power-on reset threshold voltage becomes higher at the rising state of the power supply than at the falling state of the power supply. In addition, the power-on reset threshold voltage becomes lower at the falling state of the power supply than at the rising state of the power supply.

As described above, the power-on reset circuit 10 of the first exemplary embodiment may suppress an increase in a circuit size and current consumption, and may set different power-on reset threshold voltages between the rise state and the falling state of the power supply.

In addition, since the power-on reset threshold voltages are differentiated by changing the reference current flowing in the transistor between the rise state and the falling state of the power supply, the power-on reset circuit 10 of the first exemplary embodiment does not need to provide the transistors having different threshold values. Thus, the power-on reset circuit 10 of the first exemplary embodiment may reduce steps of a semiconductor process, and may also reduce the circuit size and the current consumption.

Second Exemplary Embodiment

Figure 4:
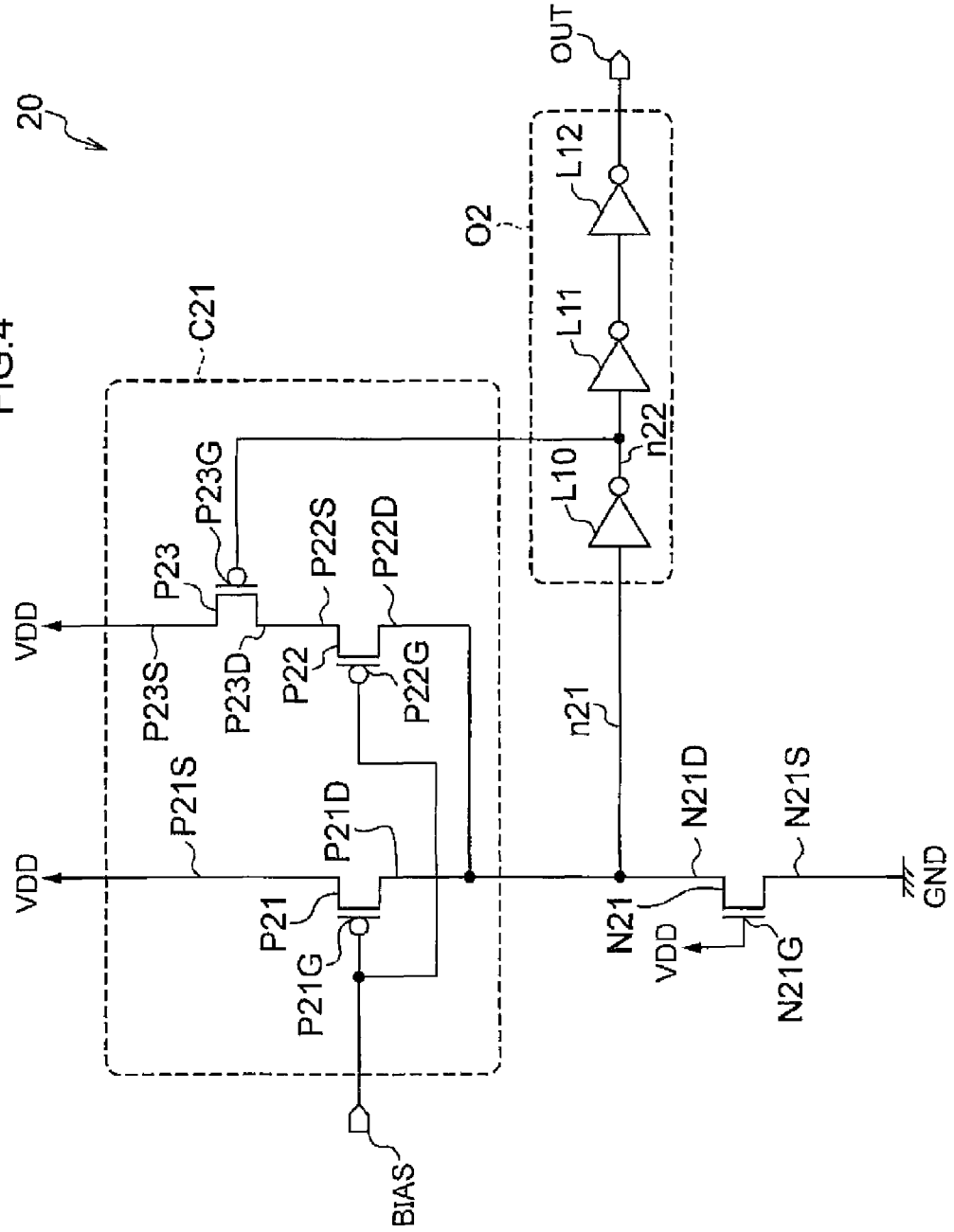
FIG. 4 is a circuit diagram illustrating a schematic configuration of a power-on reset circuit according to a second exemplary embodiment.

Next, a second exemplary embodiment will be described. FIG. 4 is a circuit diagram illustrating a power-on reset circuit according to the second exemplary embodiment of the invention. As illustrated in FIG. 4, a power-on reset circuit 20 according to the second exemplary embodiment includes an NMOS transistor N21, a control circuit C21, and an output circuit O2.

The NMOS transistor N21 includes an NMOS transistor having a first source N21S to which a fixed potential is supplied, a first drain N21D, and a first gate N21G which is connected to a power supply.

The control circuit C21 includes a first PMOS transistor P21 (hereinafter, simply referred to as the PMOS transistor P21), a second PMOS transistor P22 (hereinafter, simply referred to as the PMOS transistor P22), and a third PMOS transistor P23 (hereinafter, simply referred to as the PMOS transistor P23).

The PMOS transistor P21 includes a second source P21S which is connected to the power supply, a second drain P21D which is connected to the first drain N21D, and a second gate P21G to which a bias potential is applied. The second gate P21G is connected to a bias circuit which supplies a bias potential. The bias potential supplied by the bias circuit allows a constant current to flow between the second source P21S and the second drain P21D of the PMOS transistor P21, and thus configure a constant current source.

The PMOS transistor P22 includes a third source P22S, a third drain P22D which is connected to the first drain N21D, a third gate P22G to which a bias potential is applied. The third gate P22G is connected to the bias circuit which supplies a bias potential. The bias potential supplied by the bias circuit allows a constant current to flow between the third source P22S and the third drain P22D of the PMOS transistor P22, and thus configure the constant current source.

The PMOS transistor P23 includes a fourth source P23S which is connected to the power supply, a fourth drain P23D which is connected to the third source P22S, and a fourth gate P23G to which a second output signal from the output circuit O2 to be described later is applied. The fourth gate P23G of the PMOS transistor P23 is connected to output of an inverter L10 of the output circuit O2 as illustrated in FIG. 4. The PMOS transistor P23 controls the PMOS transistor P22 according to the second output signal output from the inverter L10.

The output circuit O2 outputs a first output signal (hereinafter, simply referred to as an output signal OUT), which is a reset signal or a power-on signal, according to a voltage of a connection point between the first drain N21D and the second drain P21D, and further, outputs the second output signal (hereinafter, referred to as a control signal). The output circuit O2 can be configured using a logic circuit, and is configured using a series circuit including the inverter L10, an inverter L11, and an inverter L12 such that a potential of a connection point between the inverter L10 and the inverter L11 is output as the control signal, and output of the inverter L12 is output as the output signal OUT. The inverter L10, the inverter L11, and the inverter L12 are configured using, for example, CMOS inverters.

In addition, the control circuit C21 increases a reference current so as to increase a threshold voltage that corresponds to the reference current flowing in the NMOS transistor N21 in a case in which the power supply is in a rise state, and decreases a reference current so as to decrease a threshold voltage that corresponds to the reference current flowing in the NMOS transistor N21 in a case in which the power supply is in a falling state, according to the control signal which is output from the output circuit O2.

Figure 5:
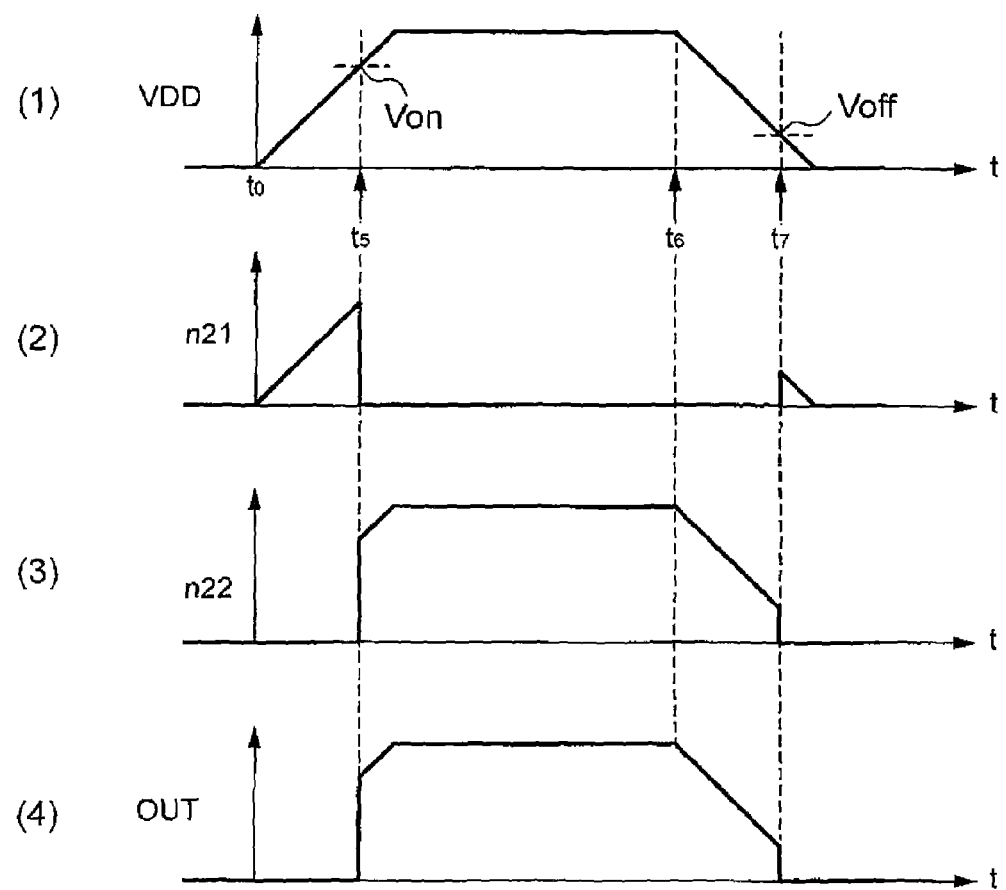
FIG. 5 is a diagram illustrating operation waveforms of the power-on reset circuit according to the second exemplary embodiment.

Next, an operation of the power-on reset circuit 20 will be described. FIG. 5 is operation waveform diagram at the time of turning ON the power supply of the power-on reset circuit 20 according to the second exemplary embodiment.

The operation waveform illustrated in (1) of FIG. 5 represents a potential of a power supply VDD of the power-on reset circuit 20 of FIG. 4. The operation waveform illustrated in (2) of FIG. 5 represents a potential of a node n21 of the power-on reset circuit 20 of FIG. 4.

The operation waveform illustrated in (3) of FIG. 5 represents a potential of a node n22 of the power-on reset circuit 20 of FIG. 4. The operation waveform illustrated in (4) of FIG. 5 represents a potential of an output terminal OUT of the power-on reset circuit 20 of FIG. 4. As illustrated in (1) of FIG. 5, a threshold voltage corresponding to a reference current flowing in the NMOS transistor N21 and a power-on reset threshold voltage match.

First, when the power supply of the power-on reset circuit 20 of FIG. 4 is turned ON at a time t0, the power supply VDD rises as illustrated in (1) of FIG. 5. Since the current flows in the PMOS transistor P21 at the time of start of the rise in the power supply, the node n21 serving as input of the inverter L10 becomes an H-level and the output signal OUT becomes an L-level as illustrated in (2) and (4) of FIG. 5.

At this time, since the output of the inverter L10 is the L-level as illustrated in (3) of FIG. 5, the PMOS transistor P23 is turned on, and current flows between the source and the drain of the PMOS transistor P23. Further, when the current flows between the source and the drain of the PMOS transistor P23, current flows also between the source and the drain of the PMOS transistor P22.

Thus, a reference current flowing in the NMOS transistor N21 increases by the amount of the current flowing in the PMOS transistor P22, as a result of which a threshold voltage of the NMOS transistor N21 in response to the reference current increases.

Incidentally, a principle by which a threshold voltage of the NMOS transistor N21 is determined is the same as the principle by which a threshold voltage of the PMOS transistor P11 is determined in the first exemplary embodiment.

Accordingly, a threshold voltage of the NMOS transistor N21 is determined corresponding to a reference current flowing in the NMOS transistor N21. In addition, the reference current flowing in the NMOS transistor N21 is determined according to a sum of the current flowing in the PMOS transistor P21, and the current flowing the PMOS transistor P22.

Next, when the power supply VDD exceeds a threshold voltage of the NMOS transistor N21 at a time t5, the NMOS transistor N21 is turned on, as a result of which the input of the inverter L10 becomes the L-level, and the output signal OUT becomes the H-level as illustrated in (2) and (4) of FIG. 5.

At this time, since the output of the inverter L10 is the H-level as illustrated in (3) of FIG. 5, the PMOS transistor P23 is turned OFF and current does not flow between the source and the drain of the PMOS transistor P23. Accordingly, current does not flow also between the source and the drain of the PMOS transistor P22, and thus, a reference current flowing the NMOS transistor N21 reflects only the amount of the current flowing in the PMOS transistor P21. Thus, a threshold voltage of the NMOS transistor N21 becomes lower than a threshold voltage at the rising state of the power supply.

Further, the power supply VDD starts to fall at a time t6 as illustrated in (1) of FIG. 5. Here, since the threshold voltage of the NMOS transistor N21 is lower than that at the rising state of the power supply, the reset signal is not output even when the power supply VDD becomes lower than a threshold voltage Von at the rising state as illustrated in (4) of FIG. 5.

Next, when the power supply VDD becomes lower than a threshold voltage Voff of the NMOS transistor N21 at a time t7 as illustrated in (2) of FIG. 5, the reset signal is output as illustrated in (4) of FIG. 5.

As a result, in a case in which the power supply VDD is equal to or lower than a threshold voltage of the NMOS transistor N21, a threshold voltage of the NMOS transistor N21 increases. In addition, in a case in which the power supply VDD is higher than a threshold voltage of the PMOS transistor N21, a threshold voltage of the NMOS transistor N21 decreases. Accordingly, the power-on reset threshold voltage becomes higher at the rising state of the power supply than at the falling state of the power supply. In addition, the power-on reset threshold voltage becomes lower at the falling state of the power supply than at the rising state of the power supply.

As described above, the power-on reset circuit 20 according to the second exemplary embodiment may suppress the increase in the circuit size and the current consumption, and may set different power-on reset threshold voltages between the rise state and the falling state of the power supply.

Third Exemplary Embodiment

Next, a third exemplary embodiment of the invention will be described. Here, the same reference numerals will be given to the same configurations as those of the power-on reset circuit 10 according to the first exemplary embodiment, and detailed descriptions thereof will be omitted.

Figure 6:
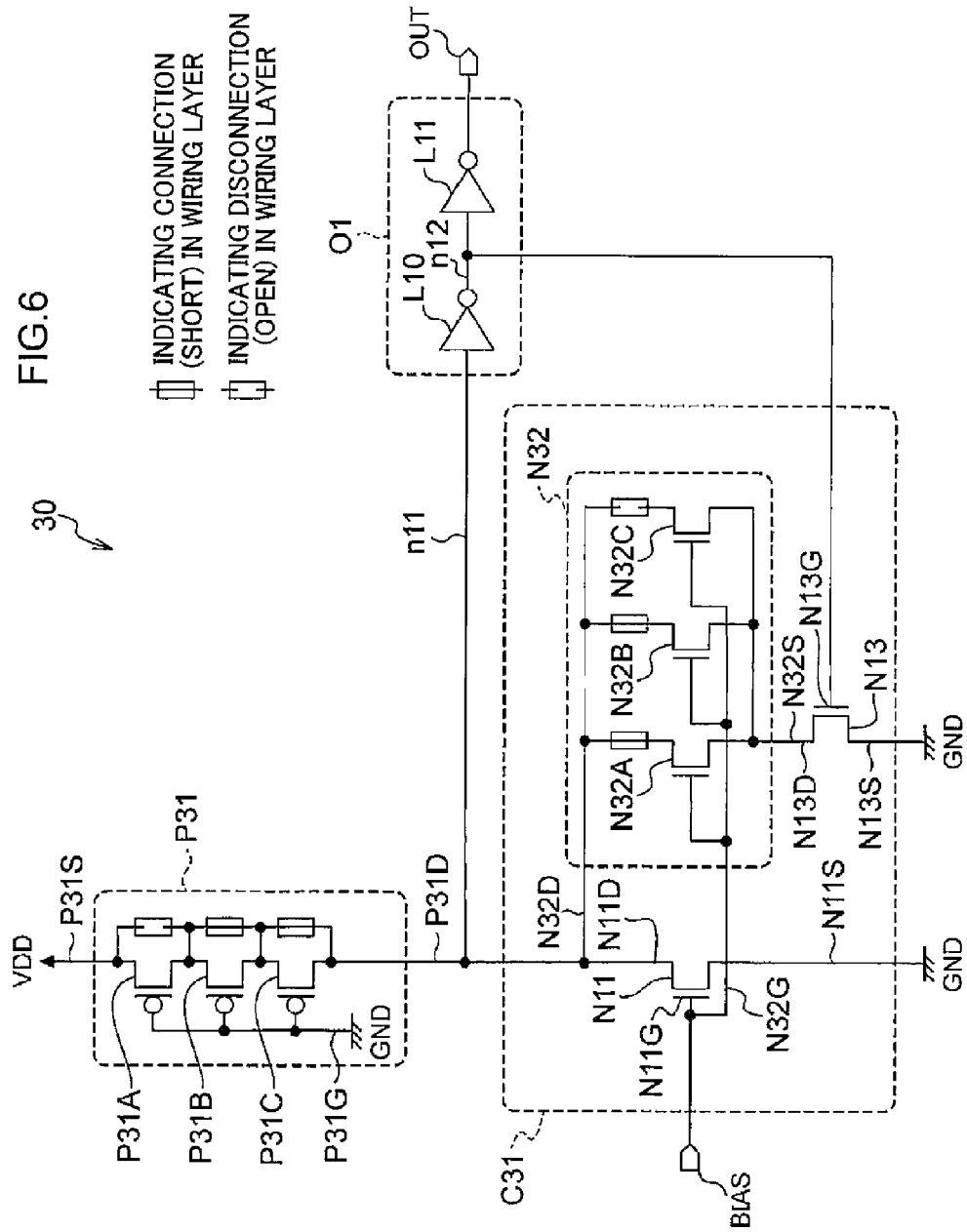
FIG. 6 is a circuit diagram illustrating a schematic configuration of a power-on reset circuit according to a third exemplary embodiment.

FIG. 6 is a circuit diagram illustrating a power-on reset circuit 30 according to the third exemplary embodiment of the invention. The power-on reset circuit according to the third exemplary embodiment includes a PMOS transistor P31, a control circuit C31, and the output circuit O1 as illustrated in FIG. 6.

The PMOS transistor P31 includes a first source P31S which is connected to the power supply, a first drain P31D, and a first gate P31G to which a fixed potential is supplied. The PMOS transistor P31 is connected so as to allow current to flow in at least any one of plural P-type transistors connected in series as illustrated in FIG. 6. In addition, the PMOS transistor P31 includes at least one PMOS transistor. In the third exemplary embodiment, a description will be made by exemplifying a case in which the PMOS transistor P31 includes three PMOS transistors. As illustrated in FIG. 6, the PMOS transistor P31 includes a PMOS transistor P31A, a PMOS transistor P31B, and a PMOS transistor P31C.

Here, a threshold voltage of the PMOS transistor is determined according to a gate length $L_{P31}$ and a gate width $W_{P31}$ of the PMOS transistor P31. Namely, the threshold voltage is determined according to a ratio $W_{P31}/L_{P31}$ between the gate length $L_{P31}$ and the gate width $W_{P31}$. The longer the gate length $L_{P31}$ of the PMOS transistor P31 becomes, the higher the threshold voltage becomes, and the shorter the gate length $L_{P31}$ becomes, the lower the threshold voltage becomes. In addition, the larger the gate width $W_{P31}$ of the PMOS transistor P31 becomes, the lower the threshold voltage becomes, and the smaller the gate width $W_{P31}$ becomes, the higher the threshold voltage becomes. In addition, the threshold voltage increases as a reference current flowing to the PMOS transistor P31 increases, and the threshold voltage decreases as the reference current decreases.

Here, a gate length of the PMOS transistor P31A is set to $L_{P31A}$, a gate length of the PMOS transistor P31B is set to $L_{P31B}$, and a gate length of the PMOS transistor P31C is set to $L_{P31C}$. In addition, a gate width of the PMOS transistor P31A is set to $W_{P31A}$, a gate width of the PMOS transistor P31B is set to $W_{P31B}$, and a gate width of the PMOS transistor P31C is set to $W_{P31C}$. Meanwhile, all $L_{P31A}$, $L_{P31B}$, and $L_{P31C}$ may be the same value, or may be different values. In addition, all $W_{P31A}$, $W_{P31B}$, and $W_{P31C}$ may be the same value, or may be different values.

In the third exemplary embodiment, at the time of manufacturing the power-on reset circuit 30, according to a power-on reset threshold voltage intended to be set, the respective PMOS transistors P31A, P31B, and P31C connected to each other are determining whether to be bypassed or not, such that at least any one of the PMOS transistors P31A, P31B, and P31C that are connected in series allow the current to flow.

Namely, in order to set the power-on reset threshold voltage to a desired value, the number of the PMOS transistors to be connected to allow the current flow increases as a value of the threshold voltage of the PMOS transistor P31, which is set in advance, increases, and the connected PMOS transistors configured the PMOS transistor P31.

Hereinafter, for example, a description will be made by exemplifying a case in which the PMOS transistor P31A is selected when the PMOS transistor P31A, the PMOS transistor P31B, and the PMOS transistor P31C connected in series are provided in advance, as illustrated in FIG. 6.

At the time of manufacturing the power-on reset circuit 30, the respective sources and drains are connected to each other so as to connect the PMOS transistor P31A, the PMOS transistor P31B, and the PMOS transistor P31C in series, and the respective sources and drains are connected using a bypass wiring as illustrated in FIG. 6.

Here, in a case in which the PMOS transistor P31A is selected according to the power-on reset threshold voltage intended to be set, the bypass wiring between the source and the drain of the PMOS transistor P31A is cut as illustrated in FIG. 6. The PMOS transistor P31A is selected as a transistor that configures the PMOS transistor P31 by cutting the bypass wiring between the source and the drain of the PMOS transistor intended to be selected. Further, it is possible to set the power-on reset threshold voltage according to the gate length $L_{P31A}$ and the gate width $W_{P31A}$ of the PMOS transistor P31A.

In addition, current flows in the PMOS transistor P31A and the PMOS transistor P31B in a case in which the bypass wiring between the source and the drain of the PMOS transistor P31A, and the bypass wiring between the source and the drain of the PMOS transistor P31B are cut, and the PMOS transistor P31A and the PMOS transistor P31B are selected.

Here, in regard to the gate length, a sum of the gate length $L_{P31A}$ of the PMOS transistor P31A, and the gate length $L_{P31B}$ of the PMOS transistor P31B becomes the gate length $L_{P31}$ of the PMOS transistor P31. Accordingly, it is possible to set the power-on reset threshold voltage according to the gate length $L_{P31A}$ and the gate width $W_{P31A}$ of the PMOS transistor P31A, and the gate length $L_{P31B}$ and the gate width $W_{P31B}$ of the PMOS transistor P31B.

The control circuit C31 includes the NMOS transistor N11, a second NMOS transistor N32 (hereinafter, simply referred to as the NMOS transistor N32), an NMOS transistor N13.

The NMOS transistor N32 includes a third source N32S, a third drain N32D which is connected to the first drain P11D, and a third gate N32G to which a bias potential is applied. the third gate N32G is connected to the bias circuit which supplies a bias potential. The bias potential supplied by the bias circuit allows a constant current to flow between the third source N32S and the third drain N32D of the NMOS transistor N32, and thus configure a constant current source.

As illustrated in FIG. 6, the NMOS transistor N32 includes plural NMOS transistors, and at least any one of the plural N-type transistors is connected in parallel. In the third exemplary embodiment, a description will be made by exemplifying a case in which the NMOS transistor N32 includes three NMOS transistors. As illustrated in FIG. 6, the NMOS transistor N32 includes an NMOS transistor N32A, an NMOS transistor N32B, and an NMOS transistor N32C.

Here, current flowing between the source N32S and the drain N32D of the NMOS transistor N32 is determined according to a gate length $L_{N32}$ and a gate width $W_{N32}$ of the NMOS transistor N32. In addition, a threshold voltage of the PMOS transistor P31 increases as the current flowing in the NMOS transistor N32 increases, and the threshold voltage of the PMOS transistor P31 decreases as the current decreases.

Here, a gate length of the NMOS transistor N32A is set to $L_{N32A}$, a gate length of the NMOS transistor N32B is set to $L_{N32B}$, and a gate length of the NMOS transistor N32C is set to $L_{N32C}$. In addition, a gate width of the NMOS transistor N32A is set to $W_{N32A}$, a gate width of the NMOS transistor N32B is set to $W_{N32B}$, and a gate width of the NMOS transistor N32C is set to $W_{N32C}$. Meanwhile, all $L_{P32A}$, $L_{P32B}$, and $L_{P32C}$ may be the same value, or may be different values. In addition, all $W_{P32A}$, $W_{P32B}$, and $W_{P32C}$ may be the same value, or may be different values.

In the third exemplary embodiment, at the time of manufacturing the power-on reset circuit 30, at least any one of the NMOS transistors N32A, N32B, and N32C is connected in parallel according to a power-on reset threshold voltage intended to be set.

Namely, in order to set the power-on reset threshold voltage to a desired value, the number of the NMOS transistors to be connected in parallel increase as a value of the threshold voltage of the PMOS transistor P31, which is set in advance, increases, and the connected NMOS transistors configure the NMOS transistor N32.

For example, a description will be made by exemplifying a case in which the NMOS transistor N32A and the NMOS transistor N32B are selected when the NMOS transistor N32A, the NMOS transistor N32B, and the NMOS transistor N32C are provided in advance as illustrated in FIG. 6.

At the time of manufacturing the power-on reset circuit 30, the respective sources are connected to each other, the respective drains are connected to each other, and the respective gates are connected to each other such that the NMOS transistor N32A, the NMOS transistor N32B, and the NMOS transistor N32C are connected in parallel as illustrated in FIG. 6.

Here, in a case in which the NMOS transistor N32A and the NMOS transistor N32B are selected according to the power-on reset threshold voltage intended to be set, a wiring between the drains of the NMOS transistor N32C is cut as illustrated in FIG. 6. Alternatively, a wiring between the sources may be cut. The NMOS transistor N32A and the NMOS transistor N32B are selected as transistors that configure the NMOS transistor N32 by cutting the wiring between the drains other than those of the NMOS transistors intended to be selected. Further, the power-on reset threshold voltage is set according to the current flowing in the NMOS transistor N32. In addition, it is possible to set the power-on reset threshold voltage according to the gate length $L_{N32A}$ and the gate width $W_{N32A}$ of the NMOS transistor N32A, and the gate length $L_{N32B}$ and the gate width $W_{N32B}$ of the NMOS transistor N32B.

In addition, in regard to the gate width, a sum of the gate width $W_{N32A}$ of the NMOS transistor N32A and the gate width $W_{N32B}$ of the NMOS transistor N32B becomes the gate width $W_{N32}$ of the NMOS transistor N32. Accordingly, it is possible to set the power-on reset threshold voltage according to the gate length $L_{N32A}$ and the gate width $W_{N32A}$ of the NMOS transistor N32A, and the gate length $L_{N32B}$ and the gate width $W_{N32B}$ of the NMOS transistor N32B.

Incidentally, the other configurations and operations of the power-on reset circuit 30 according to the third exemplary embodiment are the same as those of the first exemplary embodiment, and descriptions thereof will be omitted.

As described above, the third exemplary embodiment may set the power-on reset threshold voltage by setting the number of transistors to be connected to allow the current flow.

Fourth Exemplary Embodiment

Next, a fourth exemplary embodiment of the invention will be described. Here, the same reference numerals will be given to the same configurations as those of the power-on reset circuit 20 according to the second exemplary embodiment, and detailed descriptions thereof will be omitted.

Figure 7:
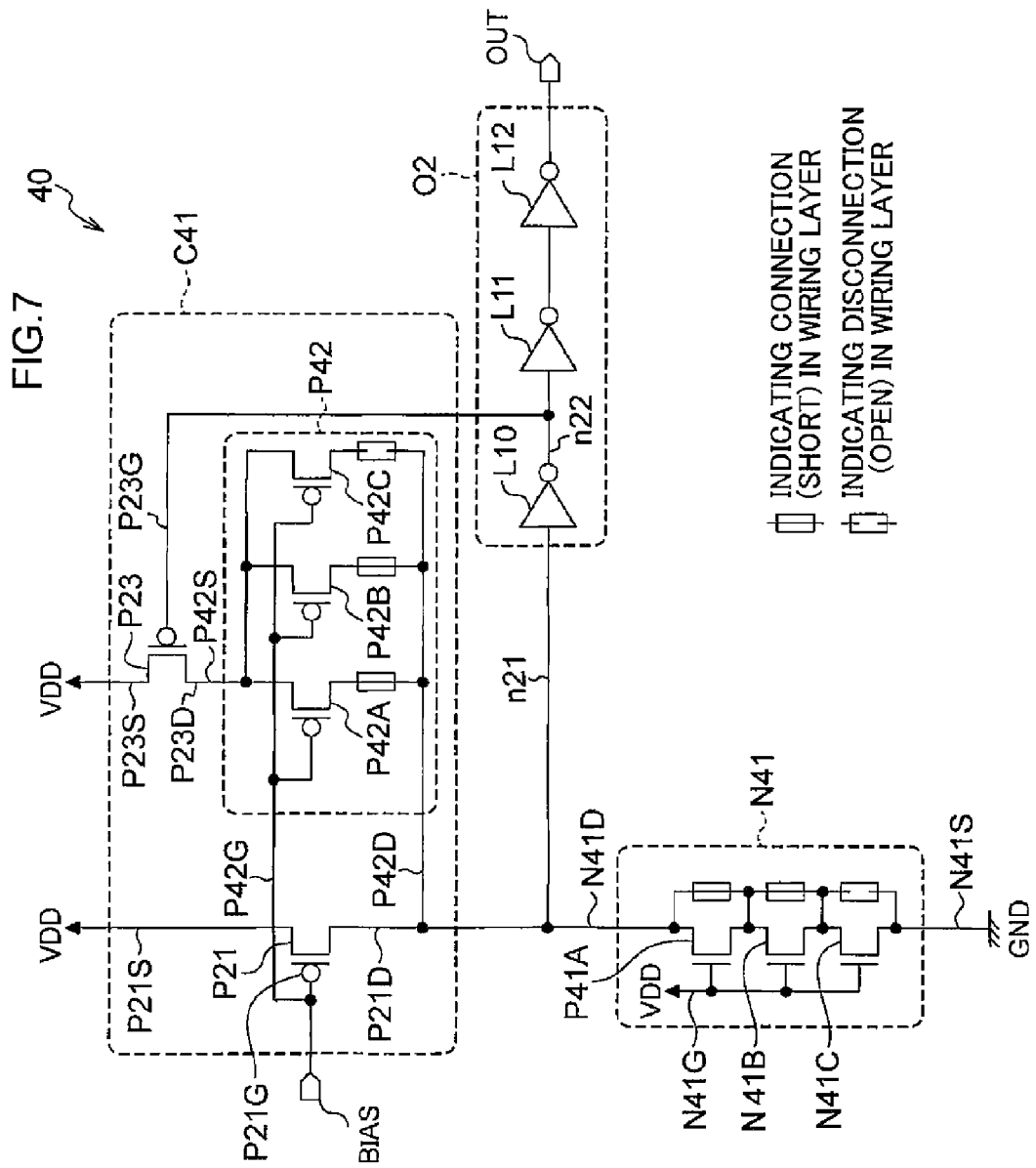
FIG. 7 is a circuit diagram illustrating a schematic configuration of a power-on reset circuit according to a fourth exemplary embodiment.

FIG. 7 is a circuit diagram illustrating a power-on reset circuit 40 according to the fourth exemplary embodiment of the invention. The power-on reset circuit according to the fourth exemplary embodiment includes an NMOS transistor N41, a control circuit C41, the output circuit O2 as illustrated in FIG. 7.

The NMOS transistor N41 includes a first source N41S to which a fixed potential is supplied, a first drain N41D, and a first gate N41G.

As illustrated in FIG. 7, the NMOS transistor N41 is connected so as to allow current flow in at least any one of plural N-type transistors is connected in series. In addition, the NMOS transistor N41 includes at least one NMOS transistor. In the fourth exemplary embodiment, a description will be made by exemplifying a case in which the NMOS transistor N41 includes three NMOS transistors. As illustrated in FIG. 7, the NMOS transistor N41 includes an NMOS transistor N41A, an NMOS transistor N41B, and an NMOS transistor N41C.

Here, a threshold voltage of the NMOS transistor N41 is determined according to a gate length $L_{N41}$ and a gate width $W_{N41}$ of the NMOS transistor N41. To be specific, the threshold voltage is determined according to a ratio $W_{N41}/L_{N41}$ between the gate length $L_{N41}$ and the gate width $W_{N41}$. The longer the gate length $L_{N41}$ of the NMOS transistor N41 becomes, the higher the threshold voltage becomes, and the shorter the gate length $L_{N41}$ becomes, the lower the threshold voltage becomes. In addition, the larger the gate width $W_{N41}$ of the NMOS transistor N41 becomes, the lower the threshold voltage becomes, and the smaller the gate width $W_{N41}$ becomes, the higher the threshold voltage becomes. In addition, the threshold voltage increases as a reference current flowing to the NMOS transistor N41 increases, and the threshold voltage decreases as the reference current decreases.

Here, a gate length of the NMOS transistor N41A is set to $L_{N41A}$, a gate length of the NMOS transistor N41B is set to $L_{N41B}$, and a gate length of the NMOS transistor N41C is set to $L_{N41C}$. In addition, a gate width of the NMOS transistor N41A is set to $W_{N41A}$, a gate width of the NMOS transistor N41B is set to $W_{N41B}$, and a gate width of the NMOS transistor N41C is set to $W_{N41C}$. Meanwhile, all $L_{P41A}$, $L_{P41B}$, and $L_{P41C}$ may be the same value, or may be different values. In addition, all $W_{P41A}$, $W_{P41B}$, and $W_{P41C}$ may be the same value, or may be different values.

In the fourth exemplary embodiment, at the time of manufacturing the power-on reset circuit 40, according to a power-on reset threshold voltage intended to be set, the respective NMOS transistors N41A, N41B, and N41C connected to each other are determined whether to be bypassed or not, such that at least any one of the NMOS transistors N41A, N41B, and N41C that are connected in series allow the current to flow.

Namely, in order to set the power-on reset threshold voltage to a desired value, the number of the NMOS transistors to be connected to allow the current flow increases as a value of the threshold voltage of NMOS transistor N41, which is set in advance, increases, and thus configure the NMOS transistor N41.

For example, a description will be made by exemplifying a case in which the NMOS transistor N41C is selected when the NMOS transistor N41A, the NMOS transistor N41B, and the NMOS transistor N41C connected in series are provided in advance, as illustrated in FIG. 7.

At the time of manufacturing the power-on reset circuit 40, the respective sources and drains are connected to each other so as to connect the NMOS transistor N41A, the NMOS transistor N41B, and the NMOS transistor N41C in series, and the respective sources and drains are connected using a bypass wiring as illustrated in FIG. 7.

Here, in a case in which the NMOS transistor N41C is selected according to the power-on reset threshold voltage intended to be set, the bypass wiring between the source and the drain of the NMOS transistor N41C is cut as illustrated in FIG. 7. The NMOS transistor N41C is selected as a transistor that configures the NMOS transistor N41 by cutting the bypass wiring between the source and the drain of the NMOS transistor intended to be selected. Further, it is possible to set the power-on reset threshold voltage according to the gate length $L_{N41C}$ and the gate width $W_{N41C}$ of the NMOS transistor N41C.

In addition, current flows in the NMOS transistor N41A and the NMOS transistor N41B in a case in which the bypass wiring between the source and the drain of the NMOS transistor N41A, and the bypass wiring between the source and the drain of the NMOS transistor N41B are cut, and the NMOS transistor N41A and the NMOS transistor N41B are selected.

Here, in regard to the gate length, a sum of the gate length $L_{N41A}$ of the NMOS transistor N41A, and the gate length $L_{N41B}$ of the NMOS transistor N41B becomes the gate length $L_{N41}$ of the NMOS transistor N41 similarly to the third exemplary embodiment. Accordingly, the present exemplary embodiment may set the power-on reset threshold voltage based on the gate length $L_{N41A}$ and the gate width $W_{N41A}$ of the NMOS transistor N41A, and the gate length $L_{N41B}$ and the gate width $W_{N41B}$ of the NMOS transistor N41B.

The control circuit C41 includes the PMOS transistor P21, a second PMOS transistor P42 (hereinafter, simply referred to as the PMOS transistor P42), and the PMOS transistor P23.

The PMOS transistor P42 includes a third source P42S, a third drain P42D which is connected to the first drain N41D, and a third gate P42G to which a bias potential is applied. The third gate P42G is connected to a bias circuit which supplies a bias potential. The bias potential supplied by the bias circuit allows current to flow between the third source P42S and the third drain P42D of the PMOS transistor P42, and thus configure a constant current source.

As illustrated in FIG. 7, the PMOS transistor P42 includes plural PMOS transistors, and at least any one of the plural P-type transistors is connected in parallel. In the fourth exemplary embodiment, a description will be made by exemplifying a case in which the PMOS transistor P42 includes three PMOS transistors. As illustrated in FIG. 7, the PMOS transistor P42 includes a PMOS transistor P42A, a PMOS transistor P42B, and a PMOS transistor P42C.

Here, current flowing between the source P42S and the drain P42D of the PMOS transistor P42 is determined according to a gate length $L_{P42}$ and a gate width $W_{P42}$ of the PMOS transistor P42. In addition, a threshold voltage of the NMOS transistor N41 increases as the current flowing in the PMOS transistor P42 increases, and the threshold voltage of the NMOS transistor N41 decreases as the current decreases.

Here, a gate length of the PMOS transistor P42A is set to $L_{P42A}$, a gate length of the PMOS transistor P42B is set to $L_{P42B}$, and a gate length of the PMOS transistor P42C is set to $L_{P42C}$. In addition, a gate width of the PMOS transistor P42A is set to $W_{P42A}$, a gate width of the PMOS transistor P42B is set to $W_{P42B}$, and a gate width of the PMOS transistor P42C is set to $W_{P42C}$. Meanwhile, all $L_{P42A}$, $L_{P42B}$, and $L_{P42C}$ may be the same value, or may be different values. In addition, all $W_{P42A}$, $W_{P42B}$, and $W_{P42C}$ may be the same value, or may be different values.

In the fourth exemplary embodiment, at the time of manufacturing the power-on reset circuit 40, at least any one of the PMOS transistors P42A, P42B, and P42C is connected in parallel, according to a power-on reset threshold voltage intended to be set.

Namely, in order to set the power-on reset threshold voltage to a desired value, the more number of the PMOS transistors to be connected in parallel increases as a value of the threshold voltage of the NMOS transistor N41, which is set in advance, increases, and thus configure the PMOS transistor P42.

For example, a description will be made by exemplifying a case in which the PMOS transistor P42A and the PMOS transistor P42B are selected when the PMOS transistor P42A, the PMOS transistor P42B, and the PMOS transistor P42C are provided in advance as illustrated in FIG. 7.

At the time of manufacturing the power-on reset circuit 40, the respective sources are connected to each other, the respective drains are connected to each other, and the respective gates are connected to each other such that the PMOS transistor P42A, the PMOS transistor P42B, and the PMOS transistor P42C are connected in parallel as illustrated in FIG. 7.

Here, in a case in which the PMOS transistor P42A and the PMOS transistor P42B are selected according to the power-on reset threshold voltage intended to be set, a wiring between the drains of the PMOS transistor P42C is cut as illustrated in FIG. 7. Alternatively, a wiring between the sources may be cut. The PMOS transistor P42A and the PMOS transistor P42B are selected as transistors that configure the PMOS transistor P42 by cutting the wiring between the drains other than those of the PMOS transistors intended to be selected. Further, the power-on reset threshold voltage is set according to the current flowing in the PMOS transistor P42. In addition, it is possible to set the power-on reset threshold voltage according to the gate length $L_{P42A}$ and the gate width $W_{P42A}$ of the PMOS transistor P42A, and the gate length $L_{P42B}$ and the gate width $W_{P42B}$ of the PMOS transistor P42B.

In addition, in regard to the gate width, a sum of the gate width $W_{P42A}$ of the PMOS transistor P42A and the gate width $W_{P42B}$ of the PMOS transistor P42B becomes the gate width $W_{P42}$ of the PMOS transistor P42. Accordingly, it is possible to set the power-on reset threshold voltage according to the gate length $L_{P42A}$ and the gate width $W_{P42A}$ of the PMOS transistor P42A, and the gate length $L_{P42B}$ and the gate width $W_{P42B}$ of the PMOS transistor P42B.

Incidentally, the other configurations and operations of the power-on reset circuit 40 according to the fourth exemplary embodiment are the same as those of the second or third exemplary embodiment, and descriptions thereof will be omitted.

As described above, the fourth exemplary embodiment may set the power-on reset threshold voltage by setting the number of transistors to be connected to allow the current flow.

Fifth Exemplary Embodiment

Next, a fifth exemplary embodiment of the invention will be described.

Figure 19A:
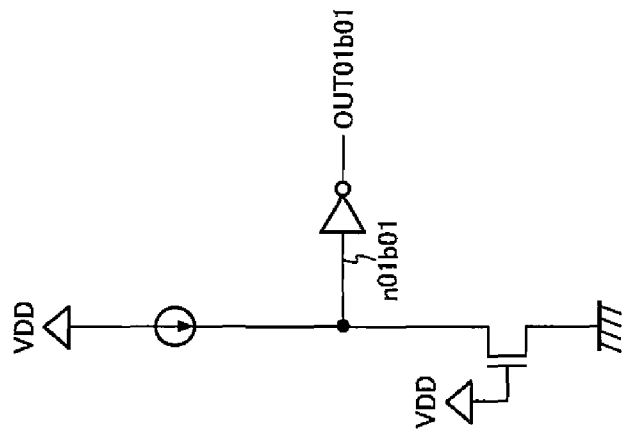
FIG. 19A to FIG. 19C are exemplary circuit diagrams of the conventional power-on reset circuit.
Figure 19B:
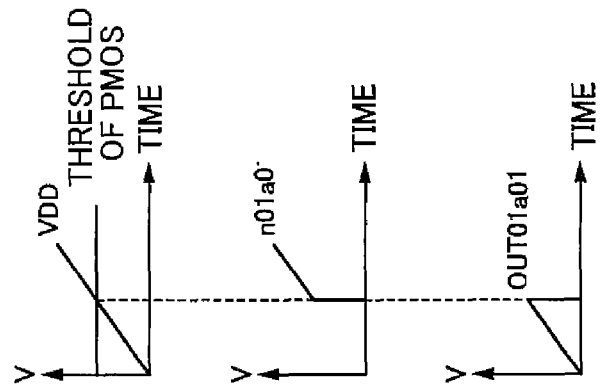
Figure 19C:
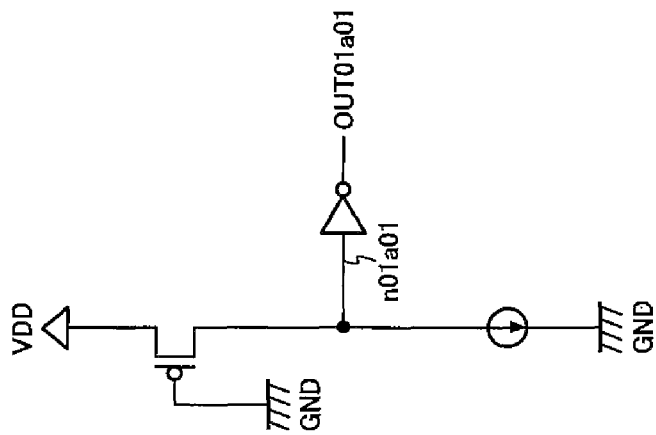

In general, in order to use the power-on reset circuit in various voltage start slopes (V/s) in a wide voltage range, there is a method of using a threshold of a MOS transistor as illustrated in FIG. 19A to FIG. 19C. The threshold changes depending on current flowing in the MOS transistor. In a case in which a power supply voltage is equal to or higher than a threshold value, for example, a power-on signal is output, and reset is released. FIG. 19A illustrates an example of the power-on reset circuit which uses the threshold of the MOS transistor. In FIG. 19A, a current source is connected to a drain side of a PMOS transistor having a gate fixed to ground. In addition, there is one state of an inverter having a node node01a01 between the PMOS transistor and the current source as input, and output of the inverter is out01a01 in FIG. 19A.

Here, a description will be made regarding the power-on reset circuit that detects a voltage of a power supply VDD as an example. This is because there is a need of performing initialization (release of power-on reset) after the power supply VDD becomes high to some extent.

FIG. 19B illustrates an operation of the power-on reset circuit illustrated in FIG. 19A. In a case in which the power supply VDD is equal to or lower than a threshold of the PMOS transistor as illustrated in FIG. 19B, the PMOS transistor is not turned on. Thus, the current source is strongly turned ON more than the PMOS transistor in such a state, as a result of which the node node01a01 becomes "L".

In a case in which the power supply VDD becomes equal to or higher than the threshold of the PMOS transistor, the PMOS transistor is turned on, thereby causing a current of equal to or higher than the current source to flow finally. Thus, the node node01a01 becomes "H", finally. At this time, the output out01a01 outputs "L".

Such a signal performs initialization, that is, power-on reset of a large-scale integration (LSI) circuit. This circuit causes current to continuously flow from a current source in a normal time. Thus, there is a need of decreasing the current.

Meanwhile, such an operation may be performed even using the configuration as illustrated in FIG. 19C. In describing the operation, current of the current source is higher when the power supply VDD is equal to or lower than the threshold of the NMOS transistor, and thus, the node node01b01 becomes "L", and the output out01b01 becomes "H".

In general, there is a risk of causing a phenomenon (chattering) in which the output becomes unstable due to noise or the like, when the power supply VDD is around the threshold of the PMOS transistor in FIG. 19A, or the power supply VDD is around a threshold of the NMOS transistor in FIG. 19C, and thus, there is a need of imparting hysteresis. In general, the hysteresis may be provided by obtaining logical OR of an L-level POR (power-on reset circuit) and an H-level POR (power-on reset circuit), changing current, changing sizes of MOS transistors or type of MOS transistors to change threshold values of the MOS transistors, or using a hysteresis comparator.

However, the threshold of the MOS transistor is around 0.7 V. Namely, a voltage of the power supply VDD at the time of releasing the power-on reset is around 0.7 V, which means that the logic needs to start operating at 0.7 V under the worst condition. In a case in which a voltage of the power supply VDD during the normal operation is 1.2 V, the voltage of 0.7 V at the power-on reset release is low. When two MOS transistors are connected in series to employ a two-threshold system, the power supply VDD at the time of releasing the power-on reset needs to be equal to or higher than 1.4 V, and accordingly, the power-on reset is not released permanently. Although, it is possible to solve such a situation by increasing current to cause the threshold of the MOS transistor to be around 0.9 V, it is necessary to set the current of the current source to be 100 times in order to raise the threshold by 0.2 V, that is, the current consumption during the normal operation increases.

The power-on reset circuit according to the fifth exemplary embodiment of the invention facilitates the setting of the power-on reset threshold voltage by allowing a degree of freedom in the power-on reset threshold voltage, and at the same time, may be operated with low current consumption during the normal operation, and be provided with the hysteresis for prevention of the chattering.

Figure 8B:
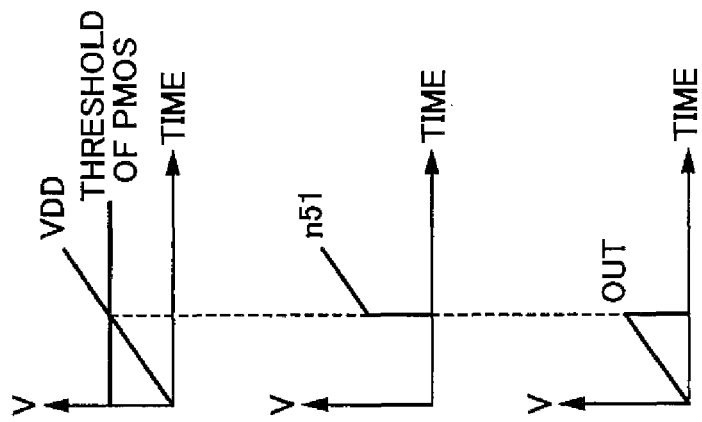
FIG. 8A and FIG. 8B are circuit diagrams illustrating schematic configurations of a power-on reset circuit according to a fifth exemplary embodiment.
Figure 8A:
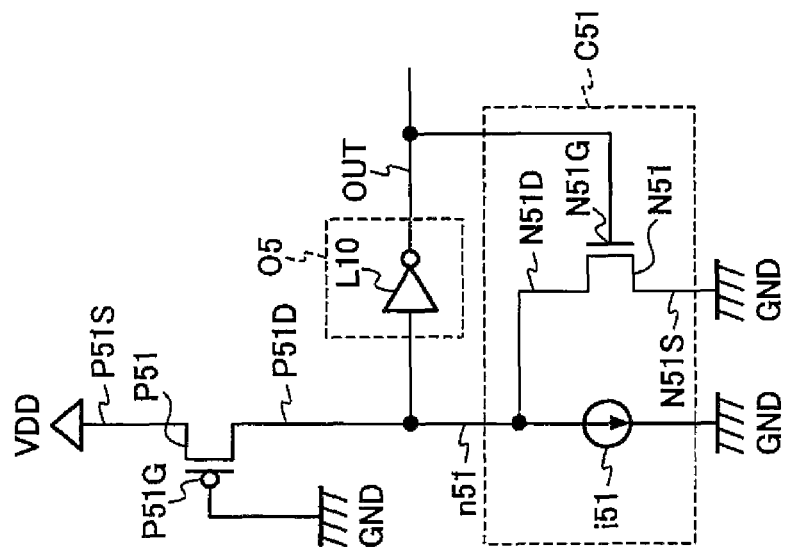

FIG. 8A is a circuit diagram illustrating a power-on reset circuit 50 according to the fifth exemplary embodiment of the invention. The power-on reset circuit according to the fifth exemplary embodiment includes a PMOS transistor P51, a control circuit C51, and an output circuit O5 as illustrated in FIG. 8A.

The PMOS transistor P51 includes a first source P51S which is connected to a power supply, a first drain P51D, and a first gate P51G to which a fixed potential is supplied.

The control circuit C51 includes an NMOS transistor N51, and a constant current source i51.

The NMOS transistor N51 includes a second source N51S to which a fixed potential is supplied, a second drain N51D which is connected to the first drain P51D, and a second gate N51G to which a second output signal from the output circuit O5 is applied. The second gate N51G of the NMOS transistor N51 is connected to an output of an inverter L10 of the output circuit O5 as illustrated in FIG. 8A. In addition, the constant current source i51 is connected to the first drain P51D.

The output circuit O5 outputs a first output signal (hereinafter, simply referred to as an output signal OUT), which is a reset signal or a power-on signal, and outputs a second output signal (hereinafter, referred to as a control signal) according to a potential of the first drain P51D. The output circuit O5 may be configured using a logic circuit, and is configured using the inverter L10 in the fifth exemplary embodiment such that output of the inverter L10 is output as the control signal and the output signal OUT. The inverter L10 is configured using, for example, a CMOS inverter.

In addition, the control circuit C51 increases a reference current so as to increase a threshold voltage that corresponds to the reference current flowing in the PMOS transistor P51 in a case in which the power supply in a rise state, and decreases a reference current so as to decrease a threshold voltage that corresponds to the reference current flowing in the PMOS transistor P51 in a case in which the power supply is in a falling state, according to the control signal which is output from the output circuit O5.

Next, an operation of the power-on reset circuit 50 will be described. As illustrated in FIG. 8B, since a node n51 becomes "L" until the power supply VDD exceeds a threshold of the PMOS transistor P51, the output signal OUT becomes "H". Since the NMOS transistor N51 is turned ON during this time, the threshold of the PMOS transistor P51 significantly increases. When current flowing in the NMOS transistor N51 is current of 100 times with respect to the constant current source i51, it is possible to roughly estimate that the threshold of the PMOS transistor P51 increases by 0.2 V. In this case, a precondition that the circuit is operated in a region in which current increases 10 times at 100 mV which is a weak inversion region of the MOS transistor. Since the node n51 becomes "H", and the output signal OUT becomes "L", the NMOS transistor N51 is turned OFF. Accordingly, only the current source drives the PMOS transistor P51, as a result of which the threshold returns to an original value (decreases by 0.2 V as compared to that at the time when the NMOS transistor N51 is turned on). Namely, the hysteresis of 0.2 V is formed. The hysteresis is provided after the power-on reset threshold voltage increases by 0.2 V. In addition, the area is also extremely small because only the area of the NMOS transistor N51 increases.

As described above, the power-on reset circuit 50 according to the fifth exemplary embodiment may suppress the increase in the circuit size and the current consumption, and set different power-on reset threshold voltages between the rise state and the falling state of the power supply.

In addition, the power-on reset circuit 50 according to the fifth exemplary embodiment may allow the degree of freedom in the power-on reset threshold voltage to facilitate the setting of the power-on reset threshold voltage, and at the same time, may enable operation with low current consumption during the normal operation, and impart the hysteresis for prevention of the chattering.

Although the description has been made by exemplifying a case in which the setting of the power-on reset threshold voltage is controlled by controlling the reference current flowing in the PMOS transistor P51, the setting of the power-on reset threshold voltage may be controlled by controlling a reference current flowing in an NMOS transistor.

Figure 9:
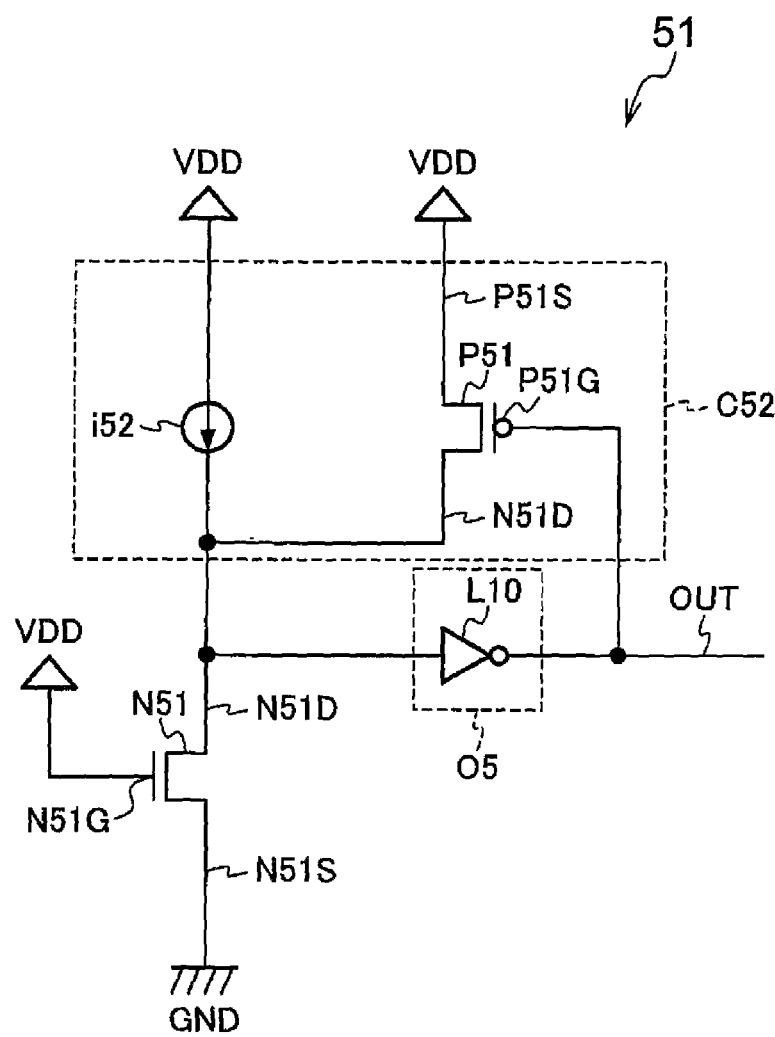
FIG. 9 is a circuit diagram illustrating a schematic configuration of the power-on reset circuit according to the fifth exemplary embodiment.

FIG. 9 illustrates a case in which a power-on reset threshold voltage is set by controlling a reference current flowing in the NMOS transistor.

A power-on reset circuit 51 illustrated in FIG. 9 includes an NMOS transistor N51, a control circuit C52, and the output circuit O5.

An NMOS transistor N51 includes a first source N51S to which a fixed potential is supplied, a first drain N51D, and a first gate N51G which is connected to the power supply.

The control circuit C52 includes a PMOS transistor P51, and a constant current source i52.

The PMOS transistor P51 includes a second source P51S which is connected to the power supply, a second drain P51D which is connected to the first drain N51D, and a second gate P51G to which the control signal from the output circuit O5 is applied. The second gate P51G of the PMOS transistor P51 is connected to the output of the inverter L10 of the output circuit O5 as illustrated in FIG. 9. In addition, the constant current source i52 is connected to the first drain N51D.

The output circuit O5 outputs the output signal OUT, which is the reset signal or the power-on signal, and outputs the control signal according to a potential of the first drain N51D.

In addition, the control circuit C52 increases a reference current so as to increase a threshold voltage that corresponds to the reference current flowing in the NMOS transistor N51 in a case in which the power supply in a rise state, and decreases a reference current so as to decrease a threshold voltage that corresponds to the reference current flowing in the NMOS transistor N51 in a case in which the power supply is in a falling state, according to the control signal which is output from the output circuit O5.

An operation of the power-on reset circuit 51 is the same as the operation of the power-on reset circuit 50.

Sixth Exemplary Embodiment

Next, a sixth exemplary embodiment of the invention will be described. Here, the same reference numerals will be given to the same configurations as those of the power-on reset circuits according to the first to fifth exemplary embodiments, and detailed descriptions thereof will be omitted.

In the fifth exemplary embodiment, an ON current is changed depending on a voltage of the output signal OUT. Namely, power supply voltage dependence (dependence on the power supply VDD) is great. Further, the ON current is not controlled. When too much current of the NMOS transistor N51 flows, a threshold of the PMOS transistor P51 becomes too high, as a result of which a situation in which the power-on reset is not released can be brought out. The sixth exemplary embodiment is added with a countermeasure circuit for such a situation.

A power-on reset circuit according to the sixth exemplary embodiment further includes a depletion-type NMOS transistor, which is different from the first to fifth exemplary embodiments. Hereinafter, the depletion-type NMOS transistor will be referred to as a DMOS transistor, for convenience of description.

Figure 10B:
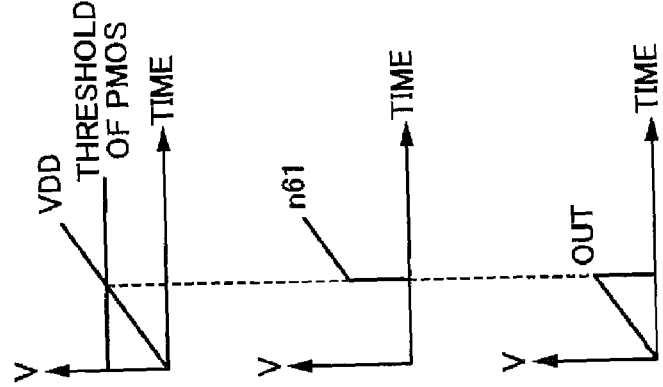
FIG. 10A and FIG. 10B are circuit diagrams illustrating schematic configurations of a power-on reset circuit according to a sixth exemplary embodiment.
Figure 10A:
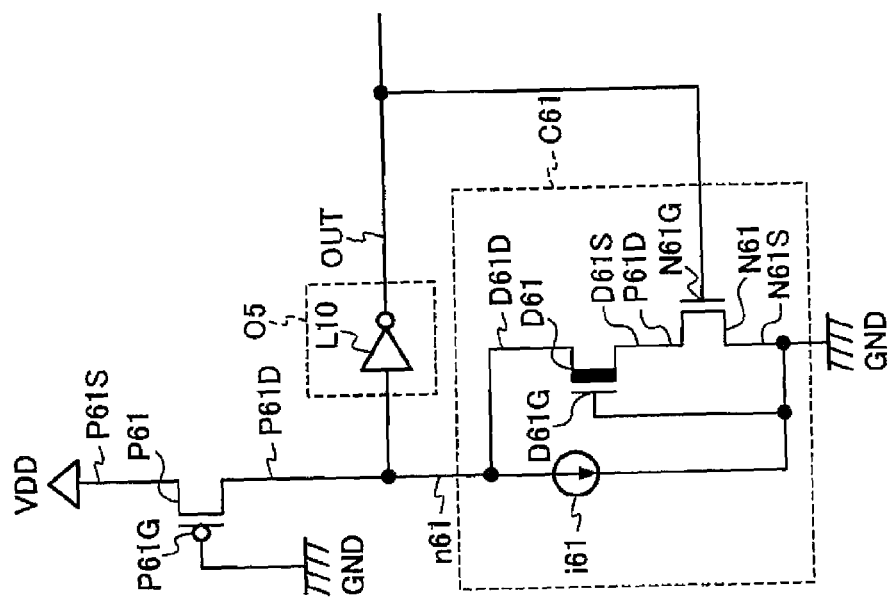

FIG. 10A is a circuit diagram illustrating a power-on reset circuit 60 according to the sixth exemplary embodiment of the invention. The power-on reset circuit 60 according to the sixth exemplary embodiment includes a PMOS transistor P61, a control circuit C61, and the output circuit O5 as illustrated in FIG. 10A.

The PMOS transistor P61 includes a first source P61S which is connected to a power supply, a first drain P61D, and a first gate P61G to which a fixed potential is supplied.

The control circuit C61 includes an NMOS transistor N61, a constant current source i61, and a DMOS transistor D61.

The NMOS transistor N61 includes a second source N61S to which a fixed potential is supplied, a second drain N61D, and a second gate N61G to which a control signal from the output circuit O5 is applied. The second gate N61G of the NMOS transistor N61 is connected to the output of the inverter L10 of the output circuit O5 as illustrated in FIG. 10A. In addition, the constant current source i61 is connected to the first drain P61D.

The DMOS transistor D61 includes a third source D61S which is connected to the second drain N61D, a third drain D61D which is connected to the first drain P61D, and a third gate D61G to which a fixed potential is supplied.

It is known that a DMOS transistor forms a current source generally by connecting a gate thereof to ground. As illustrated in FIG. 10A, an effect of applying a limit to current flowing in the NMOS transistor N61 is additionally obtained by adding the DMOS transistor D61. The NMOS transistor N61 becomes a simple switch, and power supply voltage dependence (dependence on a power supply VDD) disappear.

Namely, when the power supply VDD is lower than a threshold of the PMOS transistor P61, a node n61 is "L", and the output signal OUT is "H", and thus, the NMOS transistor N61 is turned ON. The current limited by the DMOS transistor D61 continuously flows in the NMOS transistor N61 during this time. Thus, a threshold of the PMOS transistor P61 increases, as a result of which the power-on reset threshold voltage increases.

However, if the power supply VDD once increases, and the node n61 becomes "H", the output signal OUT becomes "L", as a result of which the NMOS transistor N61 is turned OFF. Thus, the threshold decreases, and the hysteresis is caused.

The control circuit C61 increases a reference current so as to increase a threshold voltage that corresponds to the reference current flowing in the PMOS transistor P61 in a case in which the power supply in a rise state, and decreases a reference current so as to decrease a threshold voltage that corresponds to the reference current flowing in the PMOS transistor P61 in a case in which the power supply is in a falling state, according to the control signal which is output from the output circuit O5.

FIG. 10B illustrates an operation of the power-on reset circuit 60. As illustrated in FIG. 10B, since the node n61 outputs "L" until the power supply VDD exceeds a threshold of the PMOS transistor P61, the output signal OUT is output as "H". Further, since the node n61 outputs "H" when the power supply VDD exceeds the threshold of the PMOS transistor P61, the output signal OUT is output as "L".

As described above, the power-on reset circuit 60 according to the sixth exemplary embodiment may suppress the increase in the circuit size and the current consumption, and may set different power-on reset threshold voltages between the rise state and the falling state of the power supply.

In addition, since the current flowing in the NMOS transistor N61 of FIG. 10A is limited by the DMOS transistor, the power-on reset circuit 50 according to the fifth exemplary embodiment may suppress the power supply voltage dependence (dependence on the power supply VDD).

Although the description has been made by exemplifying a case in which setting of the power-on reset threshold voltage is controlled by controlling a reference current flowing in the PMOS transistor P61, the setting of the power-on reset threshold voltage may be controlled by controlling a reference current flowing in the NMOS transistor.

Figure 11:
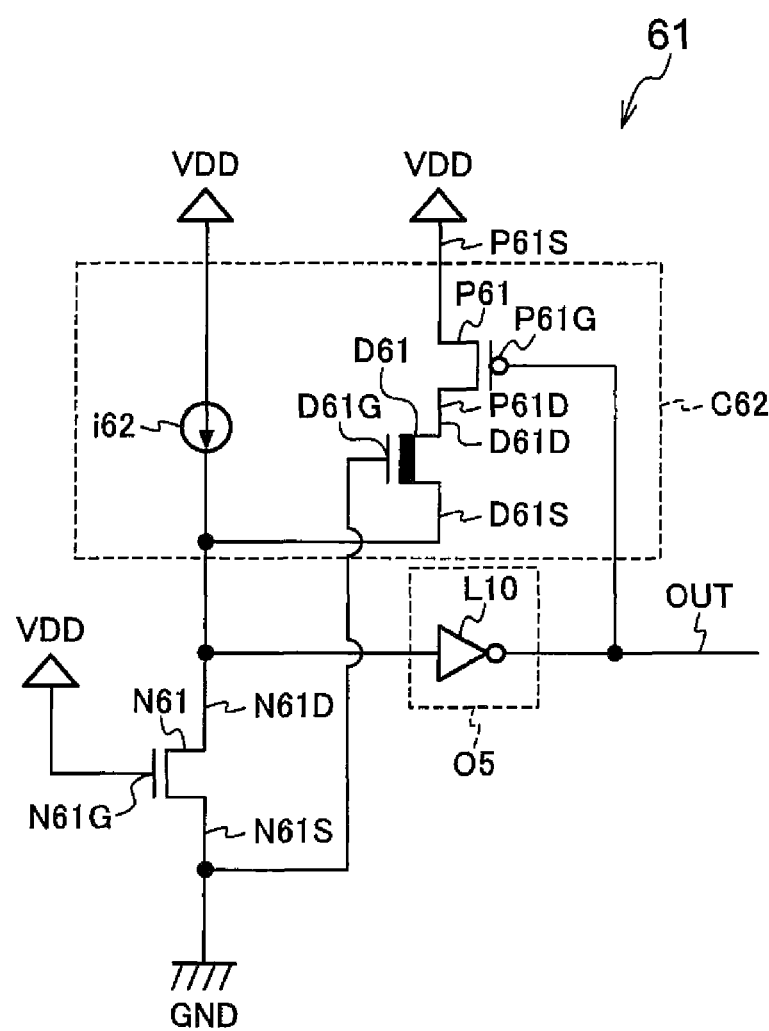
FIG. 11 is a circuit diagram illustrating a schematic configuration of the power-on reset circuit according to the sixth exemplary embodiment.

FIG. 11 illustrates a case in which a power-on reset threshold voltage is set by controlling a reference current flowing in an NMOS transistor.

A power-on reset circuit 61 illustrated in FIG. 11 includes an NMOS transistor N61, a control circuit C62, and the output circuit O5.

The NMOS transistor N61 includes a first source N61S to which a fixed potential is supplied, a first drain N61D, and a first gate N61G which is connected to a power supply.

The control circuit C62 includes a PMOS transistor P61, a constant current source i62, and a DMOS transistor D61.

The PMOS transistor P61 includes a second source P61S which is connected to the power supply, a second drain P61D, and a second gate P61G to which a control signal from the output circuit O5 is applied. The second gate P61G of the PMOS transistor P61 is connected to the output of the inverter L10 of the output circuit O5 as illustrated in FIG. 11. In addition, the constant current source i62 is connected to the first drain N61D.

The DMOS transistor D61 includes a third source D61S which is connected to the first drain N61D, a third drain D61D which is connected to the second drain P61D, and a third gate D61G to which a fixed potential is supplied.

The output circuit O5 outputs the output signal OUT, which is the reset signal or the power-on signal, and outputs the control signal according to a potential of the first drain N61D.

In addition, the control circuit C62 increases a reference current so as to increase a threshold voltage that corresponds to the reference current flowing in the NMOS transistor N61 in a case in which the power supply in a rise state, and decreases a reference current so as to decrease a threshold voltage that corresponds to the reference current flowing in the NMOS transistor N61 in a case in which the power supply is in a falling state, according to the control signal which is output from the output circuit O5.

An operation of the power-on reset circuit 61 is the same as the operation of the power-on reset circuit 60.

Seventh Exemplary Embodiment

Next, a seventh exemplary embodiment of the invention will be described. Here, the same reference numerals will be given to the same configurations as those of the power-on reset circuits according to the first to sixth exemplary embodiments, and detailed descriptions thereof will be omitted.

The source of the DMOS transistor is connected to a resistance in a power-on reset circuit according to the seventh exemplary embodiment, which is different from the sixth exemplary embodiment.

Figure 12B:
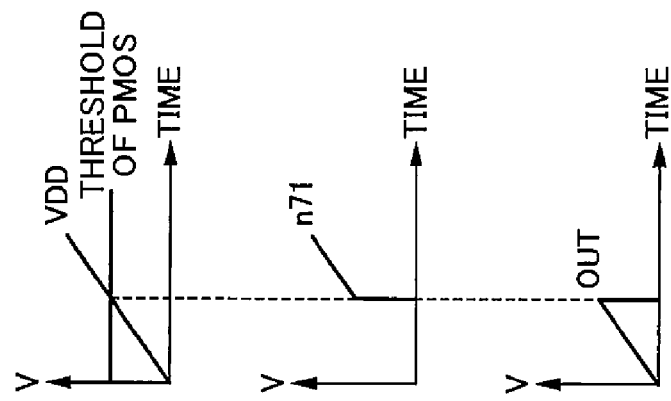
FIG. 12A and FIG. 12B are circuit diagrams illustrating schematic configurations of a power-on reset circuit according to a seventh exemplary embodiment.
Figure 12A:
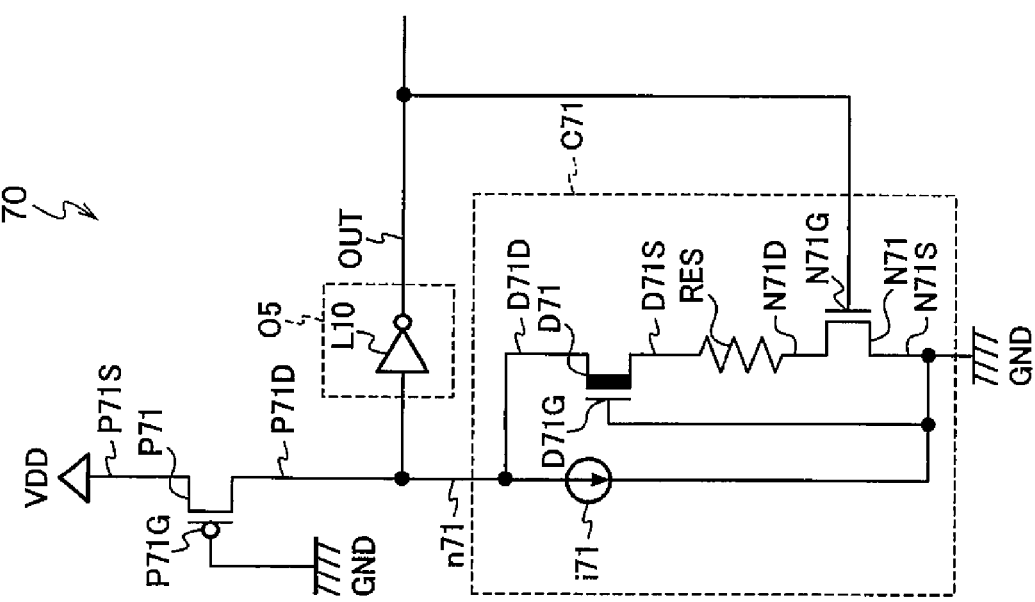

FIG. 12A is a circuit diagram illustrating a power-on reset circuit 70 according to the seventh exemplary embodiment of the invention.

The power-on reset circuit 70 according to the seventh exemplary embodiment includes an PMOS transistor P71, a control circuit C71, and the output circuit O5 as illustrated in FIG. 12A.

The PMOS transistor P71 includes a first source P71S which is connected to the power supply, a first drain P71D, and a first gate P71G to which a fixed potential is supplied.

The control circuit C71 includes an NMOS transistor N71, a constant current source i71, and a DMOS transistor D71.

The NMOS transistor N71 includes a second source N71S to which a fixed potential is supplied, a second drain N71D, and a second gate N71G to which the control signal from the output circuit O5 is applied. The second gate N71G of the NMOS transistor N71 is connected to the output of the inverter L10 of the output circuit O5 as illustrated in FIG. 12A. In addition, the constant current source i71 is connected to the first drain P71D.

The DMOS transistor D71 as a third source D71S which is connected to the second drain N71D via a resistance RES, a third drain D71D which is connected to the first drain P71D, and a third gate D71G to which a fixed potential is supplied.

As illustrated in FIG. 12A, the source D71S of the DMOS transistor D71 and the drain N71D of the NMOS transistor N71 are connected to each other via the resistance RES.

It is known that a DMOS transistor forms a current source (a threshold of the DMOS transistor/a resistance value) generally by connecting a gate thereof to ground, and adding resistance to a source. As illustrated in FIG. 12A, it becomes possible to adjust current flowing in the DMOS transistor by adding the resistance RES.

Namely, when the power supply VDD is lower than a threshold of the PMOS transistor P71, a node n71 is "L", and the output signal OUT becomes "H", as a result of which the NMOS transistor N71 is turned ON. The current limited by the DMOS transistor D71 and the resistance RES continuously flows in the NMOS transistor N71 during this time. Thus, a threshold of the PMOS transistor P71 increases, as a result of which the power-on reset threshold voltage increases.

However, if a power supply VDD once increases, and the node n71 becomes "H", the output signal OUT becomes "L", as a result of which the NMOS transistor N71 is turned OFF. Thus, the threshold decreases, and the hysteresis is caused.

The control circuit C71 increases a reference current so as to increase a threshold voltage that corresponds to the reference current flowing in the PMOS transistor P71 in a case in which the power supply in a rise state, and decreases a reference current so as to decrease a threshold voltage that corresponds to the reference current flowing in the PMOS transistor P71 in a case in which the power supply is in a falling state, according to the control signal which is output from the output circuit O5.

FIG. 12B illustrates an operation of the power-on reset circuit 70. As illustrated in FIG. 12B, since the node n71 outputs "L" until the power supply VDD exceeds a threshold of the PMOS transistor P71, the output signal OUT is output as "H". Further, since the node n71 outputs "H" when the power supply VDD exceeds the threshold of the PMOS transistor P71, the output signal OUT is output as "L".

As described above, the power-on reset circuit 70 according to the seventh exemplary embodiment may suppress the increase in the circuit size and the current consumption, and may set different power-on reset threshold voltages between the rise state and the falling state of the power supply.

In addition, a threshold of the PMOS transistor P71 of FIG. 12A may be adjusted by adjusting current flowing in the NMOS transistor N71 of FIG. 12A by adding the resistance RES. In addition, the resistance RES may be connected to the source side of the NMOS transistor N71 of FIG. 12A.

Although the description has been made by exemplifying a case in which setting of the power-on reset threshold voltage is controlled by controlling a reference current flowing in the PMOS transistor P71, the setting of the power-on reset threshold voltage may be controlled by controlling a reference current flowing in an NMOS transistor.

Figure 13:
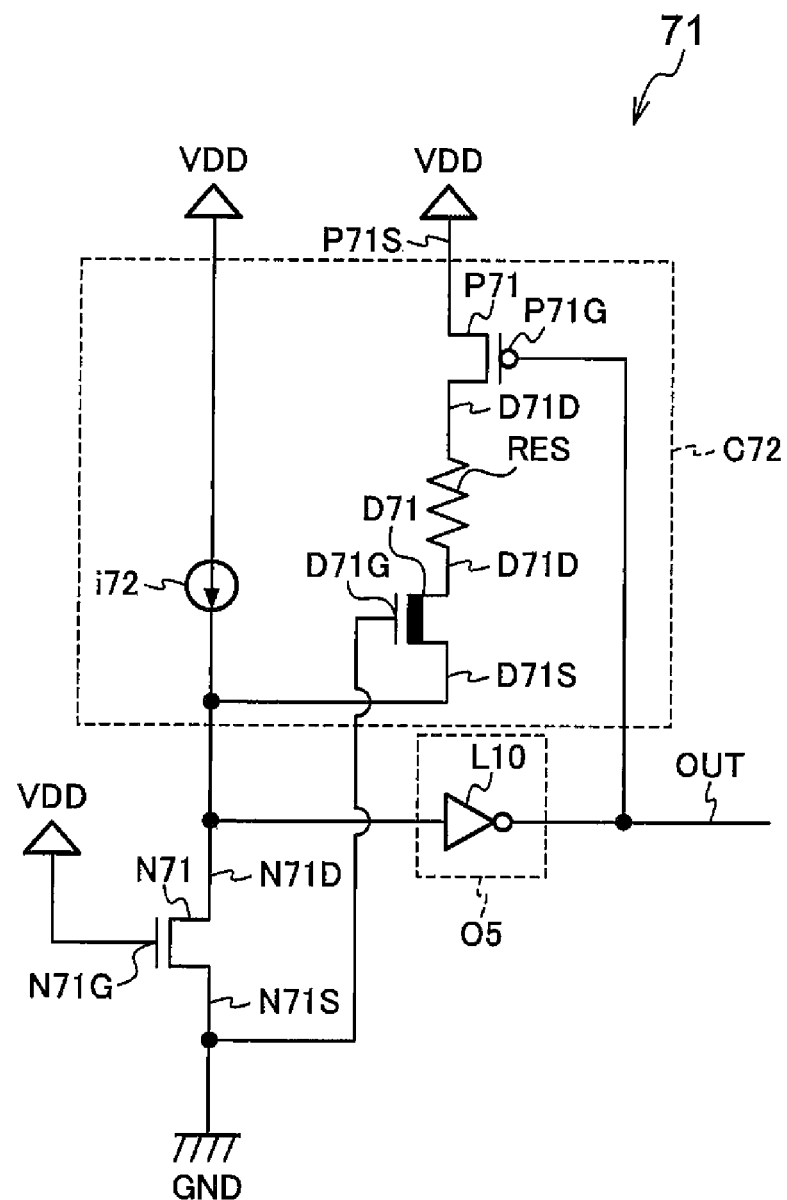
FIG. 13 is a circuit diagram illustrating a schematic configuration of the power-on reset circuit according to the seventh exemplary embodiment.

FIG. 13 illustrates a case in which a power-on reset threshold voltage is set by controlling a reference current flowing in the NMOS transistor.

A power-on reset circuit 71 illustrated in FIG. 13 includes an NMOS transistor N71, a control circuit C72, and the output circuit O5.

The NMOS transistor N71 includes a first source N71S to which a fixed potential is supplied, a first drain N71D, and a first gate N71G which is connected to a power supply.

The control circuit C72 includes a PMOS transistor P71, a constant current source i72, and a DMOS transistor D71.

The PMOS transistor P71 includes a second source P71S which is connected to the power supply, a second drain P71D, and a second gate P71G to which a control signal from the output circuit O5 is applied. The second gate P71G of the PMOS transistor P71 is connected to the output of the inverter L10 of the output circuit O5 as illustrated in FIG. 13. In addition, the constant current source i72 is connected to the first drain N71D.

The output circuit O5 outputs the output signal OUT, which is the reset signal or the power-on signal, and outputs the control signal according to a potential of the first drain N71D.

In addition, the control circuit C72 increases a reference current so as to increase a threshold voltage that corresponds to the reference current flowing in the NMOS transistor N71 in a case in which the power supply in a rise state, and decreases a reference current so as to decrease a threshold voltage that corresponds to the reference current flowing in the NMOS transistor N71 in a case in which the power supply is in a falling state, according to the control signal which is output from the output circuit O5.

An operation of the power-on reset circuit 71 is the same as the operation of the power-on reset circuit 60.

Eighth Exemplary Embodiment

Next, an eighth exemplary embodiment of the invention will be described. Here, the same reference numerals will be given to the same configurations as those of the power-on reset circuits according to the first to seventh exemplary embodiments, and detailed descriptions thereof will be omitted.

Figure 14B:
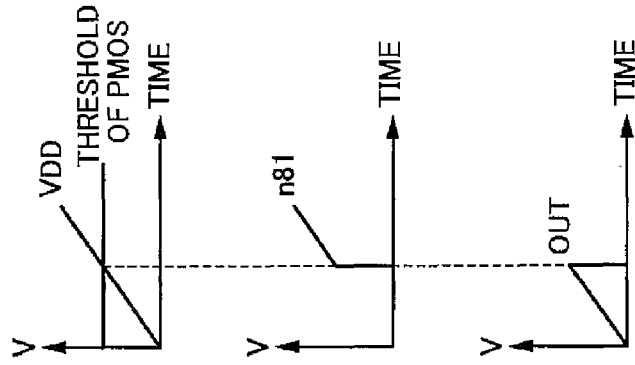
FIG. 14A and FIG. 14B are circuit diagrams illustrating schematic configurations of a power-on reset circuit according to an eighth exemplary embodiment.
Figure 14A:
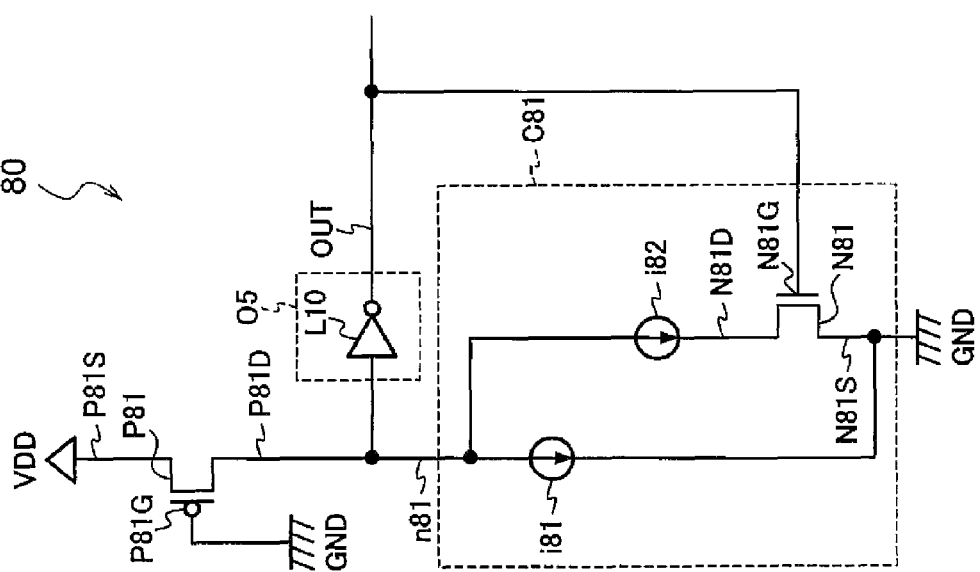

FIG. 14A is a circuit diagram illustrating a power-on reset circuit 80 according to the eighth exemplary embodiment of the invention. The power-on reset circuit 80 according to the eighth exemplary embodiment includes a PMOS transistor P81, a control circuit C81, and the output circuit O5 as illustrated in FIG. 14A.

The PMOS transistor P81 includes a first source P81S which is connected to the power supply, a first drain P81D, and a first gate P81G to which a fixed potential is supplied.

The control circuit C81 includes an NMOS transistor N81, a constant current source i81, and a constant current source i82 as an example of a first constant current source.

The NMOS transistor N81 includes a second source N81S to which a fixed potential is supplied, a second drain N81D, and a second gate N81G to which the control signal from the output circuit O5 is applied. The second gate N81G of the NMOS transistor N81 is connected to the output of the inverter L10 of the output circuit O5 as illustrated in FIG. 14A. Further, the second drain N81D of the NMOS transistor N81 is connected to the first drain P81D via the constant current source i82. In addition, the constant current source i81 is connected to the first drain P81D.

The control circuit C81 increases a reference current so as to increase a threshold voltage that corresponds to the reference current flowing in the PMOS transistor P81 in a case in which the power supply in a rise state, and decreases a reference current so as to decrease a threshold voltage that corresponds to the reference current flowing in the PMOS transistor P81 in a case in which the power supply is in a falling state, according to the control signal which is output from the output circuit O5.

FIG. 14B illustrates an operation of the power-on reset circuit 80. As illustrated in FIG. 14B, since a node n81 outputs "L" until the power supply VDD exceeds a threshold of the PMOS transistor P81, the output signal OUT is output as "H". Further, since the node n81 outputs "H" when the power supply VDD exceeds the threshold of the PMOS transistor P81, the output signal OUT is output as "L".

FIG. 15A and FIG. 15B illustrate waveforms of operation simulation of the power-on reset circuit 80 according to the eighth exemplary embodiment. As illustrated in FIG. 15A and FIG. 15B, it is understood that threshold voltages are different between in a case in which the power supply is in the rise state and in a case in which the power supply is in the falling state.

As described above, the power-on reset circuit 80 according to the eighth exemplary embodiment may suppress the increase in the circuit size and the current consumption, and may set different power-on reset threshold voltages between the rise state and the falling state of the power supply.

Although the description has been made by exemplifying a case in which setting of the power-on reset threshold voltage is controlled by controlling a reference current flowing in the PMOS transistor P81, the setting of the power-on reset threshold voltage may be controlled by controlling a reference current flowing in an NMOS transistor.

Figure 16:
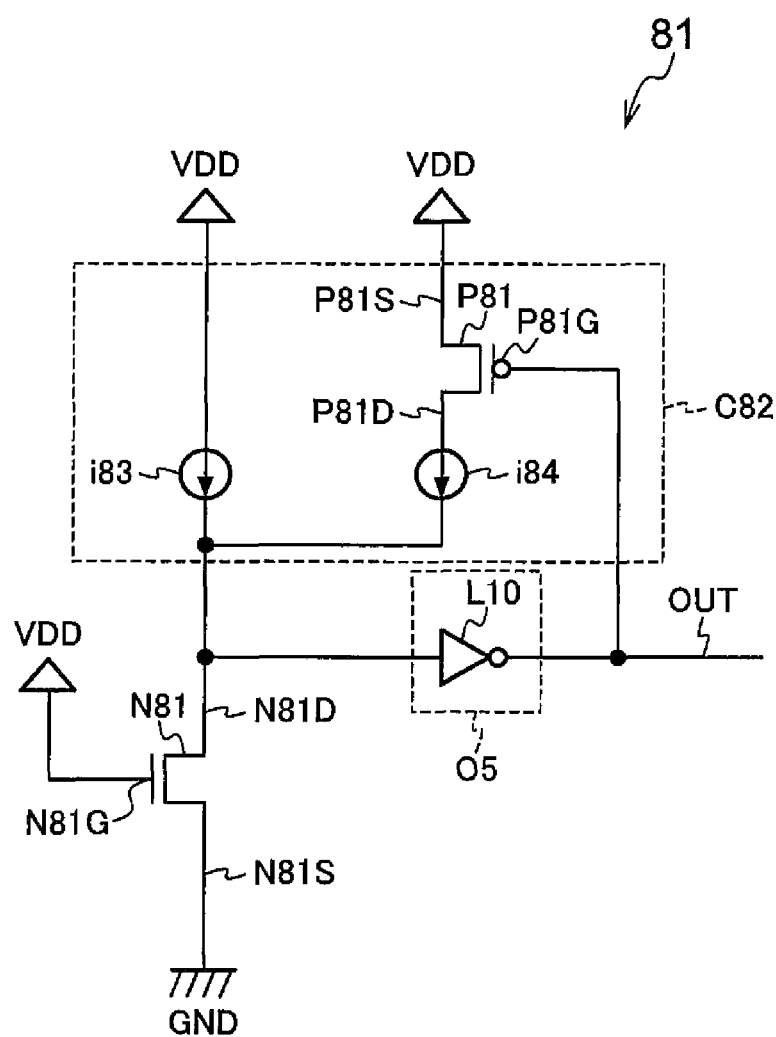
FIG. 16 is a circuit diagram illustrating a schematic configuration of the power-on reset circuit according to the eighth exemplary embodiment.
Figure 17:
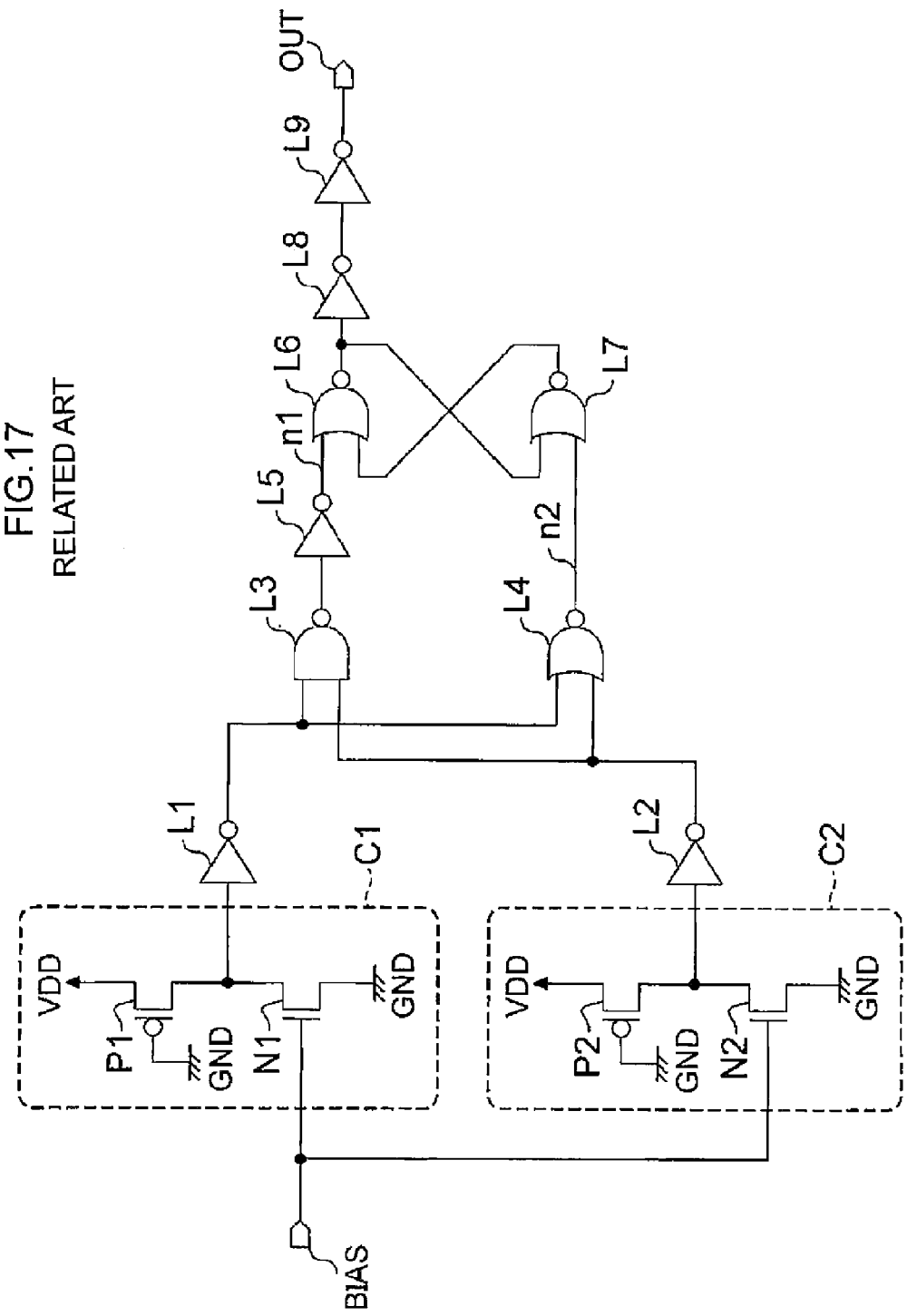
FIG. 17 is an exemplary circuit diagram of a conventional power-on reset circuit.
Figure 18:
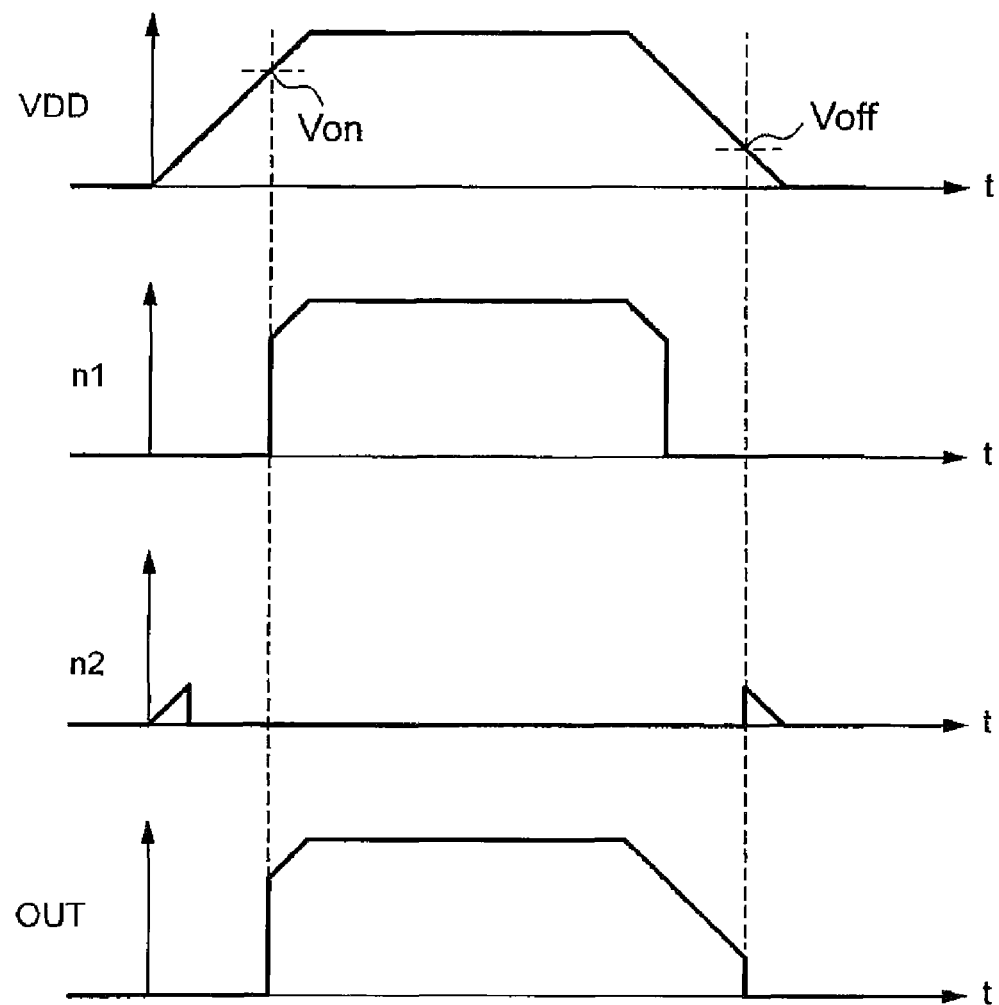
FIG. 18 is a diagram illustrating an operation waveform of the conventional power-on reset circuit.

FIG. 16 illustrates a case in which a power-on reset threshold voltage is set by controlling a reference current flowing in the NMOS transistor.

A power-on reset circuit 81 illustrated in FIG. 16 includes an NMOS transistor N81, a control circuit C82, and the output circuit O5.

The NMOS transistor N81 includes a first source N81S to which a fixed potential is supplied, a first drain N81D, and a first gate N81G which is connected to a power supply.

The control circuit C82 includes a PMOS transistor P81, a constant current source i83, and a constant current source i84 as an example of the first constant current source.

The PMOS transistor P81 includes a second source P81S which is connected to the power supply, a second drain P81D, and a second gate P81G to which a control signal from the output circuit O5 is applied. The second gate P81G of the PMOS transistor P81 is connected to the output of the inverter L10 of the output circuit O5 as illustrated in FIG. 16. Further, the second drain P81D of the PMOS transistor P81 is connected to the first drain N81D via the constant current source i83. In addition, the constant current source i84 is connected to the second drain P81D.

The output circuit O5 outputs the output signal OUT, which is the reset signal or the power-on signal, and outputs the control signal according to a potential of the first drain N81D.

In addition, the control circuit C82 increases a reference current so as to increase a threshold voltage that corresponds to the reference current flowing in the NMOS transistor N81 in a case in which the power supply in a rise state, and decreases a reference current so as to decrease a threshold voltage that corresponds to the reference current flowing in the NMOS transistor N81 in a case in which the power supply is in a falling state, according to the control signal which is output from the output circuit O5.

An operation of the power-on reset circuit 81 is the same as the operation of the power-on reset circuit 80.

Incidentally, positions of the constant current source i82 and the NMOS transistor N81 in FIG. 14A may be reversed. In addition, positions of the constant current source i84 and the PMOS transistor P81 in FIG. 16 may be reversed in the same manner.

Although the exemplary embodiments of the invention have been described as above, the invention is not limited to aspects of the respective exemplary embodiment described above, and various modifications thereof can be made.

For example, a circuit coping with an electrostatic discharge failure is not illustrated in the exemplary embodiments, and thus, it is also possible to use the invention in combination with the circuit coping with the electrostatic discharge failure.

In addition, the logic circuit portion in the output circuits O1 and O2 of the exemplary embodiments is an example, and the same effect may be obtained even with a different logic circuit.

In addition, the disclosure may be applied to a voltage detection circuit that detects a desired voltage with respect to voltages having hysteresis or a voltage determination circuit that performs voltage determination with respect to voltages having hysteresis by using the same circuit configuration as the power-on reset circuits that have been described in the exemplary embodiments.

In addition, in the third exemplary embodiment, a case in which the PMOS transistor P31 is at least one PMOS transistor which is connected so as to allow current to flow in at least any one of plural P-type transistors connected in series, and the NMOS transistor N32 is at least one NMOS transistor in which at least any one of plural N-type transistors is connected in parallel, have been described. However, the present disclosure is not limited thereto.

For example, it may be configured such that the PMOS transistor P31 is at least one PMOS transistor which is connected so as to allow current to flow in at least any one of plural P-type transistors connected in series, and the NMOS transistor N32 includes a single NMOS transistor similarly to the first exemplary embodiment.

In addition, for example, it may be configured such that the NMOS transistor N32 is at least one NMOS transistor in which at least any one of plural N-type transistors is connected in parallel, and the PMOS transistor P31 includes a single PMOS transistor similarly to the first exemplary embodiment.

In addition, in the fourth exemplary embodiment, the description has been made by exemplifying a case in which the NMOS transistor N41 is at least one NMOS transistor which is connected so as to allow current to flow in at least any one of plural N-type transistors connected in series, and the PMOS transistor P42 is at least one PMOS transistor in which at least any one of plural P-type transistors is connected in parallel, but the invention is not limited thereto.

For example, it may be configured such that the NMOS transistor N41 is at least one NMOS transistor which is connected so as to allow current to flow in at least any one of plural N-type transistors connected in series, and the PMOS transistor P42 includes a single PMOS transistor similarly to the second exemplary embodiment.

In addition, for example, it may be configured such that the PMOS transistor P42 is at least one PMOS transistor in which at least any one of plural P-type transistors is connected in parallel, and the NMOS transistor N41 includes a single NMOS transistor similarly to the second exemplary embodiment.

In addition, in the third exemplary embodiment, the description has been made by exemplifying a case in which the PMOS transistor P31 is connected so as to allow current to flow in at least any one of plural P-type transistors connected in series, but the invention is not limited thereto. For example, at least any one of plural P-type transistors may be connected in parallel.

In addition, in the third exemplary embodiment, the description has been made by exemplifying a case in which at least any one of plural N-type transistors is connected in parallel in the NMOS transistor N32, but the invention is not limited thereto. For example, the NMOS transistor N32 may be connected so as to allow current to flow in at least any one of plural N-type transistors connected in series.

In addition, similarly, the description has been made by exemplifying a case in which the NMOS transistor N41 is connected so as to allow current to flow in at least any one of plural N-type transistors connected in series in the fourth exemplary embodiment. However, the invention is not limited thereto, and at least any one of plural N-type transistors may be connected in parallel.

In addition, in the fourth exemplary embodiment, the description has been made by exemplifying a case in which at least any one of plural P-type transistors is connected in parallel in the PMOS transistor P42, but the invention is not limited thereto. For example, the PMOS transistor P42 may be connected so as to allow current to flow in at least any one of plural P-type transistors connected in series.

The other aspect of the present disclosure is a semiconductor circuit including: an NMOS transistor that includes a first source to which a fixed potential is supplied, a first drain, and a first gate connected to a power supply; a control circuit that includes a PMOS transistor which includes a second source connected to the power supply, a second drain connected to the first drain, and an second gate; and an output circuit that outputs a first output signal, which is a reset signal or a power-on signal, and outputs a second output signal according to a potential of the first drain, wherein the control circuit increases the reference current so as to increase a threshold voltage corresponding to the reference current flowing in the NMOS transistor in a case in which the power supply in a rise state, and decreases the reference current so as to decrease a threshold voltage corresponding to the reference current flowing in the NMOS transistor in a case in which the power supply is in a falling state according to the second output signal which is output from the output circuit.

In the above aspect, the control circuit may further include a constant current source connected to the first drain.

In the above aspect, the constant current source may be a second NMOS transistor that includes a third source to which a fixed potential is supplied, a third drain connected to the first drain, and a third gate to which a bias potential is applied.

In the above aspect, the constant current source may be a second PMOS transistor that includes a third source connected to the power supply, a third drain connected to the first drain, and a third gate to which a bias potential is applied.

The other aspect of the present disclosure is a voltage detection circuit including the semiconductor circuit according to the first aspect.

The other aspect of the present disclosure is a voltage determination circuit including the semiconductor circuit according to the first aspect.

What is claimed is:
1. A semiconductor circuit comprising:
a PMOS transistor that includes a first source connected to a power supply, a first drain, and a first gate to which a fixed potential is supplied;
a control circuit comprising an NMOS transistor that includes a second source to which a fixed potential is supplied, a second drain connected to the first drain, and a second gate; and
an output circuit that outputs a first output signal, which is a reset signal or a power-on signal, and outputs a second output signal according to a potential of the first drain,
wherein, according to the second output signal which is output from the output circuit, the control circuit controls the NMOS transistor so as to increase a reference current flowing in the PMOS transistor such that a threshold voltage of the PMOS transistor increases in a case in which the power supply is in a rising state, and controls the NMOS transistor so as to decrease the reference current flowing in the PMOS transistor such that the threshold voltage of the PMOS transistor decreases in a case in which the power supply is in a falling state.

2. The semiconductor circuit according to claim 1, wherein the control circuit further includes a constant current source which is connected to the first drain.

3. The semiconductor circuit according to claim 2, wherein the constant current source is a second NMOS transistor that includes a third source to which a fixed potential is supplied, a third drain connected to the first drain, and a third gate to which a bias potential is applied.

* * * * *